US 11,841,388 B2

(12) United States Patent
Menzel et al.

(10) Patent No.: US 11,841,388 B2
(45) Date of Patent: Dec. 12, 2023

(54) SYSTEMS AND METHODS FOR INTELLIGENT EVENT WAVEFORM ANALYSIS

(71) Applicant: Schneider Electric USA, Inc., Andover, MA (US)

(72) Inventors: Johannes Menzel, Eybens (FR); Jon Bickel, Murfreesboro, TN (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 17/851,205

(22) Filed: Jun. 28, 2022

(65) Prior Publication Data

US 2022/0326286 A1 Oct. 13, 2022

Related U.S. Application Data

(63) Continuation of application No. 17/044,918, filed as application No. PCT/US2019/025736 on Apr. 4, 2019, now Pat. No. 11,442,083.

(Continued)

(51) Int. Cl.
*G01R 19/25* (2006.01)
*H02J 3/00* (2006.01)
*H02J 13/00* (2006.01)

(52) U.S. Cl.
CPC ..... *G01R 19/2513* (2013.01); *G01R 19/2509* (2013.01); *H02J 3/00* (2013.01);
(Continued)

(58) Field of Classification Search
CPC ............ G01R 19/2513; G01R 19/2509; G01R 31/088; H02J 3/00; H02J 3/0012; H02J 3/003; H02J 13/00002; Y04S 10/18
See application file for complete search history.

(56) References Cited

U.S. PATENT DOCUMENTS

2004/0138834 A1* 7/2004 Blackett ................ G01D 4/004
702/62
2011/0161020 A1 6/2011 Pun
(Continued)

FOREIGN PATENT DOCUMENTS

CN 103633639 A 3/2014
CN 105556418 A 5/2016
(Continued)

OTHER PUBLICATIONS

Partial Supplementary European Search Report and Written Opinion dated Nov. 17, 2021 for European Patent Application No. 19780963.5-1010, 15 pages.
(Continued)

*Primary Examiner* — Ziaul Karim
(74) *Attorney, Agent, or Firm* — Locke Lord LLP

(57) ABSTRACT

In a method and system, voltage and/or current signals on an electrical/power system is monitored. A power event is identified from the monitored voltage and/or current signals. In response to event identification, waveforms of the monitored voltage and/or current signals are captured. Energy-related signals are calculated and extracted from pre-event measurements, event measurements and post-event measurements using the captured waveforms. Additional information associated with the event is identified and calculated by comparing (a) the calculated and used energy-related signals from pre-event measurements, with (b) the calculated and used energy-related signals from post-event measurements.

18 Claims, 16 Drawing Sheets

Related U.S. Application Data

(60) Provisional application No. 62/788,392, filed on Jan. 4, 2019, provisional application No. 62/785,297, filed on Dec. 27, 2018, provisional application No. 62/652,888, filed on Apr. 4, 2018.

(52) U.S. Cl.
CPC ............ H02J 3/003 (2020.01); H02J 3/0012 (2020.01); H02J 13/00002 (2020.01)

(56) References Cited

U.S. PATENT DOCUMENTS

| | | |
|---|---|---|
| 2012/0209552 A1 | 8/2012 | Spanier et al. |
| 2013/0141827 A1 | 6/2013 | Ukil et al. |
| 2014/0176121 A1* | 6/2014 | Davis .................... A46B 9/028 324/126 |
| 2015/0160296 A1 | 6/2015 | Saarinen et al. |
| 2015/0331035 A1 | 11/2015 | Li et al. |
| 2017/0270414 A1* | 9/2017 | Ignatova ................. G06N 5/04 |
| 2017/0285114 A1* | 10/2017 | Bickel ................ G01R 19/2513 |

FOREIGN PATENT DOCUMENTS

| | | |
|---|---|---|
| EP | 1007986 B1 | 5/2003 |
| EP | 2603960 B1 | 2/2015 |

OTHER PUBLICATIONS

International Search Report and Written Opinion dated Jul. 5, 2019 in International Application Serial No. PCT/2019/025736, 18pp.
Chinese Office Action dated Sep. 28, 2023 for corresponding Chinese Application No. 201980030230.3, 14 pages.

* cited by examiner

| TYPE | BEFORE | AFTER | SIGNAL |
|---|---|---|---|
| CURRENT | 250A | 25A | LOST 90% LOADS |
| CURRENT | 100A | 250A | ADDED 150% LOADS |
| CURRENT | 100A | 300A | ADDED 66% LOADS, AT NOMINAL MAX (IF PREVIOUS MAX(OVER 2H MEAN VALUE) WAS 300A) |
| FREQUENCY 0 VOLTAGE CROSS | 0 CROSS REF TIMESTAMP | NEW 0 CROSS IS ref +1/8 CYCLE TIME STAMP | PROBABLE SOURCE CHANGE IDENTIFIED |
| FREQUENCY 0 VOLTAGE CROSS | 0 CROSS REF TIMESTAMP | BACK TO <1% OF PREVIOUS 0 CROSS REF | SAME SOURCE |
| POWER FACTOR | 0.6 | 0.9 | IF NO LOAD LEVEL CHANGED CAPACITOR BANK ENERGIZED |
| POWER FACTOR | 0.95 | 0.85 | IF NO LOAD LEVEL CHANGED CAPACITOR BANK DE-ENERGIZED |
| POWER FACTOR & CURRENT | 0.9 (PF) 100(A) | 0.7 (PF) 300(A) | MAJOR LOAD WAS TURNED "ON", AND THE POWER FACTOR WAS IMPACTED (IN THIS CASE INDUCTIVE MOTOR). |

FIG. 11

SYSTEMS AND METHODS FOR INTELLIGENT EVENT WAVEFORM ANALYSIS

CROSS-REFERENCE TO RELATED APPLICATIONS

The present application is a continuation of U.S. Ser. No. 17/044,918 which is a U.S. National Stage Entry of International Application No. PCT/US2019/025736 filed on Apr. 4, 2019 and claims priority to U.S. Provisional Application Ser. No. 62/652,888 which was filed on Apr. 4, 2018, U.S. Provisional Application Ser. No. 62/785,297 which was filed on Dec. 27, 2018 and U.S. Provisional Application Ser. No. 62/788,392 which was filed on Jan. 4, 2019, all of the applications of which are incorporated by reference herein in their entirety.

FIELD

The present disclosure is generally directed to intelligent event waveform capture (WFC) analysis in an automation control and metering environment.

BACKGROUND

The changing world of energy is making it increasingly challenging to optimize power reliability, energy costs, and operational efficiency such as in critical power environments (e.g., hospitals, data centers, airports, and manufacturing facilities). Utility power grids are becoming more dynamic and facility power distribution systems are becoming more complex and sensitive to power quality issues due to increasing electronic control devices, threatening network stability. Competitive pressures and environmental regulations are pushing expectations for energy efficiency and business sustainability higher than ever. Addressing these challenges requires new digital tools designed specifically to enable faster response to opportunities and risks related to electrical/power system reliability and operational stability.

Power quality disturbances are a primary cause of unexpected business downtime and equipment malfunction/damage/failure. According to some estimates, power quality disturbances are responsible for 30-40% of business downtime, and power quality problems cost companies roughly 4% of their annual revenue. Examples of the detrimental effects to equipment that may be attributed to power quality disturbances include overheating of equipment components (e.g., motors, capacitors, cables, transformers, etc.), accelerated wear and tear, premature aging of equipment components, malfunctions and misoperations, and erroneous circuit breaker or relays operations.

The economic impact produced by power quality disturbances may include increased energy bills, additional financial penalties (e.g., penalties resulting from power disruptions), and potentially detrimental impacts on the environment (e.g., increased carbon footprint). Power quality disturbances may also adversely result in increased charges related to demand, increases in electrical/power system losses, and increases in voltage drops. Three examples of areas that are influenced by power quality disturbances include: uptime, asset condition, and energy efficiency. For example, system uptime may be affected by electrical installations intentionally or inadvertently being removed from service due to voltage sags, interruptions, and/or undervoltage/overvoltage conditions. Moreover, nuisance trips of circuits caused by harmonics, voltage swells, or transients may also lead to reduced uptime. Assets (e.g., cables, transformers, capacitor banks, etc.) may be detrimentally affected by power quality disturbances or conditions. For instance, overheating of equipment, an unplanned change in design characteristics, and/or a decreased service life are just a few impacts caused by power quality anomalies. Finally, the efficient use of energy is also affected by power quality disturbances.

According to a specific example, capacitor banks may be affected by power quality disturbances (e.g., harmonics) which are characterized as a steady-state distortion of the voltage and/or current signals. Non-linear power loads from electric arc furnaces (EAFs), electric railways, thyristor-based voltage and frequency modifying devices have become primary harmonic sources in a power grid. These systems inject large amounts of harmonic currents into the electrical/power system, leading to distortion of the fundamental current signal in the power grid. Harmonics may adversely impact the normal operations of capacitor banks in numerous ways (e.g., increasing power losses, producing harmonic resonance, increasing harmonic currents, and reducing the service life of the capacitor bank through additional heating).

Proper interpretation of power quality data may provide businesses and energy providers the ability to limit detrimental effects caused by power quality disturbances. Energy procurement managers may use power quality data to identify and avoid penalties or to revise/update energy contracts. Likewise, maintenance engineers may use power quality data to properly diagnose equipment issues and improve root cause analysis and reduce equipment downtime.

It may be impractical to collect and store all power quality data from an electrical/power system. The power quality data collected during a power quality event or other power issue may be insufficient to provide a proper interpretation of power quality problems on the electrical/power system, which is important to maintaining and improving the electrical system's performance.

SUMMARY

In accordance with an exemplary embodiment, methods and systems are provided to analyze power events in a power system, which may be performed using at least an intelligent electronic device (IED) including a processor, sensor and memory. In the methods and systems, voltage and/or current signals on the power system is/are monitored. A power event in the electrical/power system is identified from at least one of the monitored voltage and/or current. In response to identifying the power event, waveform data of the at least one of the monitored voltage and/or current are captured and stored. Energy-related information is determined (e.g., identified, measured, calculated, derived, used and/or extracted) from pre-event measurements using the captured waveforms. Energy-related information is also determined (e.g., identified, measured, calculated, derived, used and/or extracted) during the event and from post-event measurements using the captured waveforms. The energy-related information can include energy-related parameter(s), signal(s), indicator(s), status(es), and/or other information. Additional information associated from the power event is identified, calculated, derived and/or determined by comparing (a) the determined energy-related information from pre-event measurements, with (b) the determined energy-related information from post-event measurements. In some cases, the pre-event information may be compared with data during the event. Also, data taken during an event may be compared to data taken at the terminus of said event. The IED may be a device or system (e.g., meters, drives, UPSs, breakers, relays, other power equipment associated with or connected to the electrical/power system, or other component and/or device capable of measuring and capturing energy signals).

The power event may be a power quality event. The additional information may include for example: evidence of capacitor bank switching in the electrical/power system or loss of load in the electrical/power system. The system and method may further involve determining at least one cause of the power event from the additional information, determining an impact of the power event on equipment in the electrical/power system, or performing an action affecting at least one component in the electrical/power system based on the additional information. The at least one component may include equipment in the electrical/power system. The IED may be coupled to the electrical/power system equipment.

The captured waveforms may be waveforms of the monitored voltage and/or current signals from a first-time period before a start of the identified power event to a second-time period after an end of the identified power event. The power may be derived for example from the voltage and current. The first-time period or the second-time period may be adjusted (e.g., dynamically adjustable) according to a condition on the electrical/power system (e.g., variable durations of power quality events).

The additional information may also include a phase shift (e.g., may also be referred to as a phase shift) of the monitored voltage and/or current, which satisfies a phase shift threshold condition. The additional information may also include identification of one or more duration variations in the monitored voltage and/or current by determining duration of each half-cycle of a waveform from the captured waveforms.

In accordance with a further exemplary embodiment, methods and systems are provided to create a power event profile for an electrical/power system using an intelligent electronic device (IED) including at least a processor, sensor and memory. In the method and system, voltage and/or current on an electrical/power system is monitored. During normal or typical operation of the electrical/power system, waveforms of the monitored voltage and/or current, e.g., at desired predefined time periods or random time periods. When the captured waveforms represent an unknown power event profile of a normal operation of the electrical/power system, a new power event profile of normal or typical operation is created for the captured waveforms. A digital repository is updated with the new power event profile of normal or typical operation.

In accordance with an exemplary embodiment, the present disclosure contemplates a system for intelligent event analysis. A consequence of a disturbance may be determined. For example, disturbance data may be collected for select portions (e.g., before and/or after a disturbance) of a disturbance event. Sets of measurements may be iteratively calculated at the control node based on the collected disturbance data. The iterative calculations may be monitored for a change threshold. When the iterative calculations meet the change threshold, the iterative calculations may be correlated to an impact criterion, the impact criterion being used to determine a consequence of the disturbance.

In accordance with another exemplary embodiment, analysis of waveform data typically focuses on the disturbance itself; however, there is pre-event/post-event non-disturbance data which is usually ignored. For example, the pre-event/during/post-event characteristics of a disturbance waveform capture (WFC) may be analyzed to determine whether a capacitor bank has been energized (e.g., "switched on"). This determination may be based on a combination of the WFC event characteristics, changes in the real/reactive/apparent load requirements, changes in the power factor. This information may also indicate the location of the IED capturing the said event, electrically/physically upstream or downstream from said capacitor bank. would indicate the IED capturing the said WFC is physically/electrically installed upstream from the capacitor bank. For example, a change in the reactive power may indicate the capacitor bank energized downstream from the IED. The IED may derive various parameters from the captured waveform(s), for example mean squared (MS) or root mean squared (RMS) values for voltage, current, power, reactive power, THD and discrete harmonics, based on the capabilities of the IED. An array (e.g., spreadsheet table) of these values may be computed from the pre-event and/or post-event data. This array may be used this enrich (e.g. tag) each event waveform with pre-event/during/post-event parameters for each waveform (e.g., any large waveforms data base). It would then be possible to automatically analyze these waveforms array (e.g. using attributes) for detecting statistically significant changes.

Additional objects and advantages will be set forth in part in the description which follows, and in part will be obvious from the description, or may be learned by practice of the present disclosure and/or claims. At least some of these objects and advantages may be realized and attained by the elements and combinations particularly pointed out in the appended claims.

It is to be understood that both the foregoing general description and the following detailed description are exemplary and explanatory only and are not restrictive of the invention, as disclosed or claimed. The claims should be entitled to their full breadth of scope, including equivalents.

DESCRIPTION OF THE FIGURES

The description of the various example embodiments is explained in conjunction with the appended drawings.

FIG. 11 provides a Table that lists examples of additional information, which may be determined by evaluating pre-event and post event measurement data in accordance with various exemplary embodiments of the present disclosure.

DISCUSSION OF EXAMPLE EMBODIMENTS

Method and systems are provided to enhance event analysis by monitoring, capturing and analyzing measurement data, including pre-event, event and post-event data, of signal waveforms representative of voltage and/or current signals or other measurable and/or derivable electrical property monitored on an electrical/power system when an event is detected. The pre-event and post-event measurement data may be captured over a duration of time or time period (e.g., one-half, one, one and one-half, two or more cycles), which is fixed or changed according to for example monitored propert(ies) on the electrical/power system, a user input, or a system command from another network node. The captured measurement data (e.g., pre-event waveform(s) before detection of the event, event waveform(s) during the event and post-event waveform(s) after detection of a terminus of the event) may be analyzed for phase shifts, duration variations, differences in magnitude or phase angle, or other anomalies within one or more power line phases to provide additional information related to the detected event.

Method and systems are also provided to identify, create and store new power event profiles for normal operation (e.g., a power event representative of normal operations) in a digital repository by capturing and analyzing measurement and/or derived energy data (e.g., waveforms of voltage and/or current signals or other measurable and/or derivable electrical property monitored on the electrical/power system) during normal operation of the electrical/power system.

These and other example features of the present disclosure will be described below in further detail with reference to the figures.

I. Network System Architecture

Figure 1:
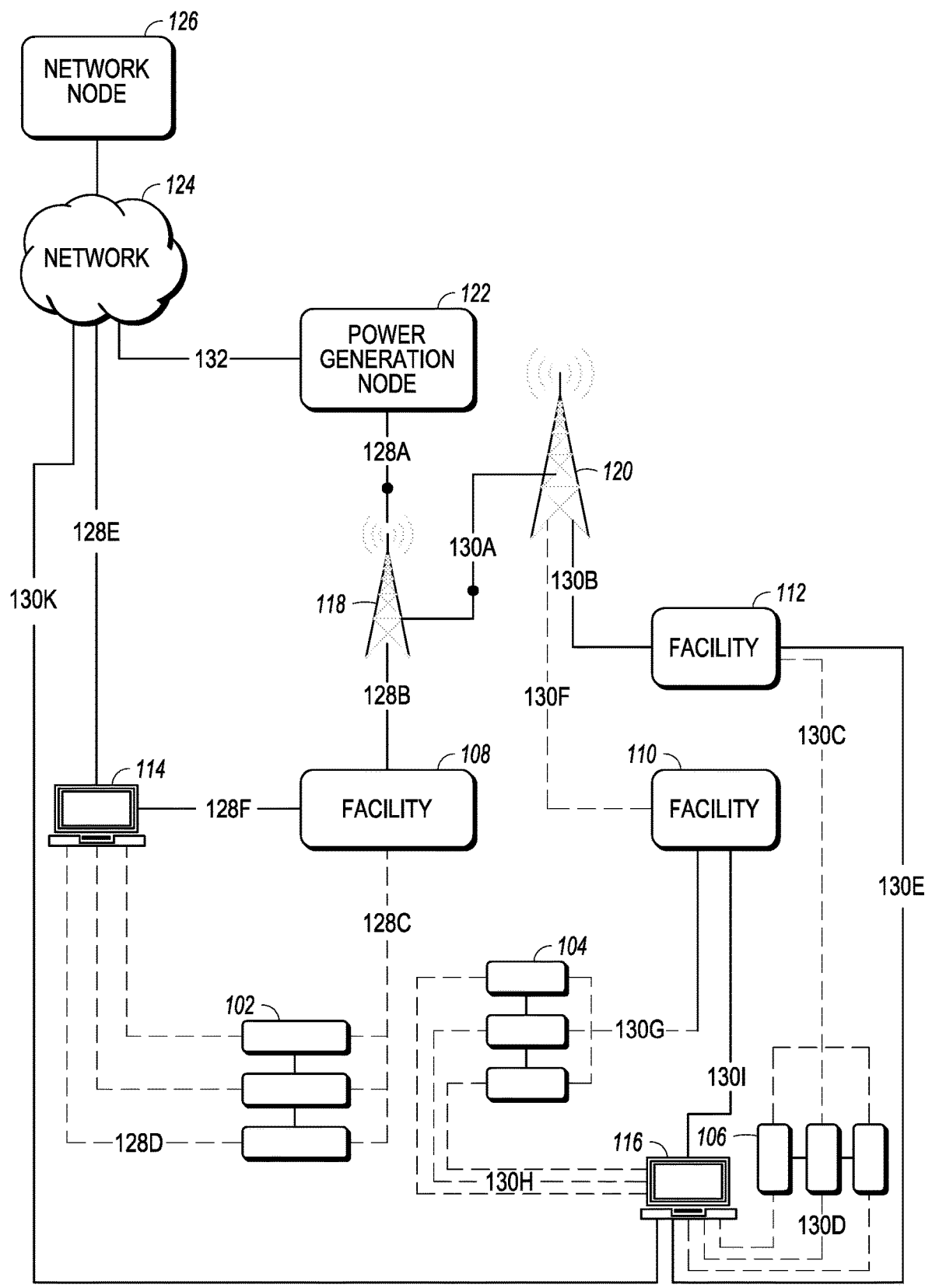
FIG. 1 is a schematic view of an exemplary network configured to intelligently analyze power events on an electrical/power system in accordance with an exemplary embodiment of the present disclosure

Referring to FIG. 1, there is depicted a schematic view of an exemplary network system architecture configured to perform among other things intelligent event analysis at a network node(s). The architecture includes one or more network nodes 126, user devices 114 and 116 to monitor and control equipment or other devices 102, 104 and 106 of the facilities 108, 110 and 112. The architecture also includes an electrical/power system including a power generation node(s) 122 to supply power to the facilities 108, 110 and 112 across a power distribution network of a utility, e.g., power grids 118 and 120, and the facilities. The facilities 108, 110 and 112 may be an automated industrial facility or include automated industrial equipment. The systems and devices in the network architecture may use a local area network (LAN), wide area network (WAN), or internetwork (including the Internet) to communicate over a communication network 124. The communication network 124 may be a wired and/or wireless network that uses, for example, physical and/or wireless data links to carry network data among (or between) the network nodes.

Each network node 126 may include a computer system (e.g., an intelligent electronic device (IED)), to sense, monitor, capture and analyze power-related data on the electrical/power system. In accordance with the various embodiments, the IED may capture signal waveforms representative of voltage, current, power or other measurable electrical property on the electrical/power system, create power event profiles, perform event analysis to identify power events and additional information using the waveforms including pre-event/during-event/post-event waveforms, and perform other operations as part of the waveform capture and event analysis described herein. The IED may be a smart device (e.g., a smart power meter or other power equipment, or incorporated into or associated with a power meter or other power equipment on the electrical/power system). The architecture may include a plurality of IEDs arranged at different upstream and downstream positions in a hierarchical level or layer relationship on the electrical/power system to monitor and share power-related information (e.g., measurement data, derived data, event data and additional information, results of event analysis, event profiles, etc.) at any desired position along the electrical/power system, including positions along the grid, between the utility and a facility, and within the facility. Example components of a computer system are described further below with reference to FIG. 10.

II. Event Analysis and Waveform Capture

1. Pre-Event and Post Event

A power event, such as a power quality (PQ) event, may be detected and categorized by monitoring, identifying, capturing and analyzing measured and/or derived data (e.g., waveforms, of voltage and/or current signals or other measurable and/or derivable electrical property on an electrical/power system). These operations may be performed on a computer system (e.g., a smart power meter or other intelligent electronic device (IED)). The measurement data is captured when an event is detected/triggered, such as when a threshold, rule or condition is satisfied or violated. These set points may be derived from norms, local or utility related regulations or from best practices, from industry specific standards or recommendations or industry segment specific levels. The waveform(s) from the start to the terminus of the event (e.g., the event waveform) may be captured, and analyzed to identify relevant representative parameters, elements, and/or statistical/analysis dimensions, such as magnitude of the electrical property, harmonics, power factor, duration of the event, event severity, disturbance direction detection (DDD), or other event characteristics. The event severity may be derived by calculating for instance the "magnitude*duration" or any similar or more complex indicator which may be representative of the event or useful for later calculations and analysis. The DDD may show for example at each meter's level if the event most probably originated upstream or downstream of the meter. The data for detected event(s) may be reported in an event report to other computer systems (e.g., other IEDs), which are part of a monitoring system in a network system architecture.

Figure 2:
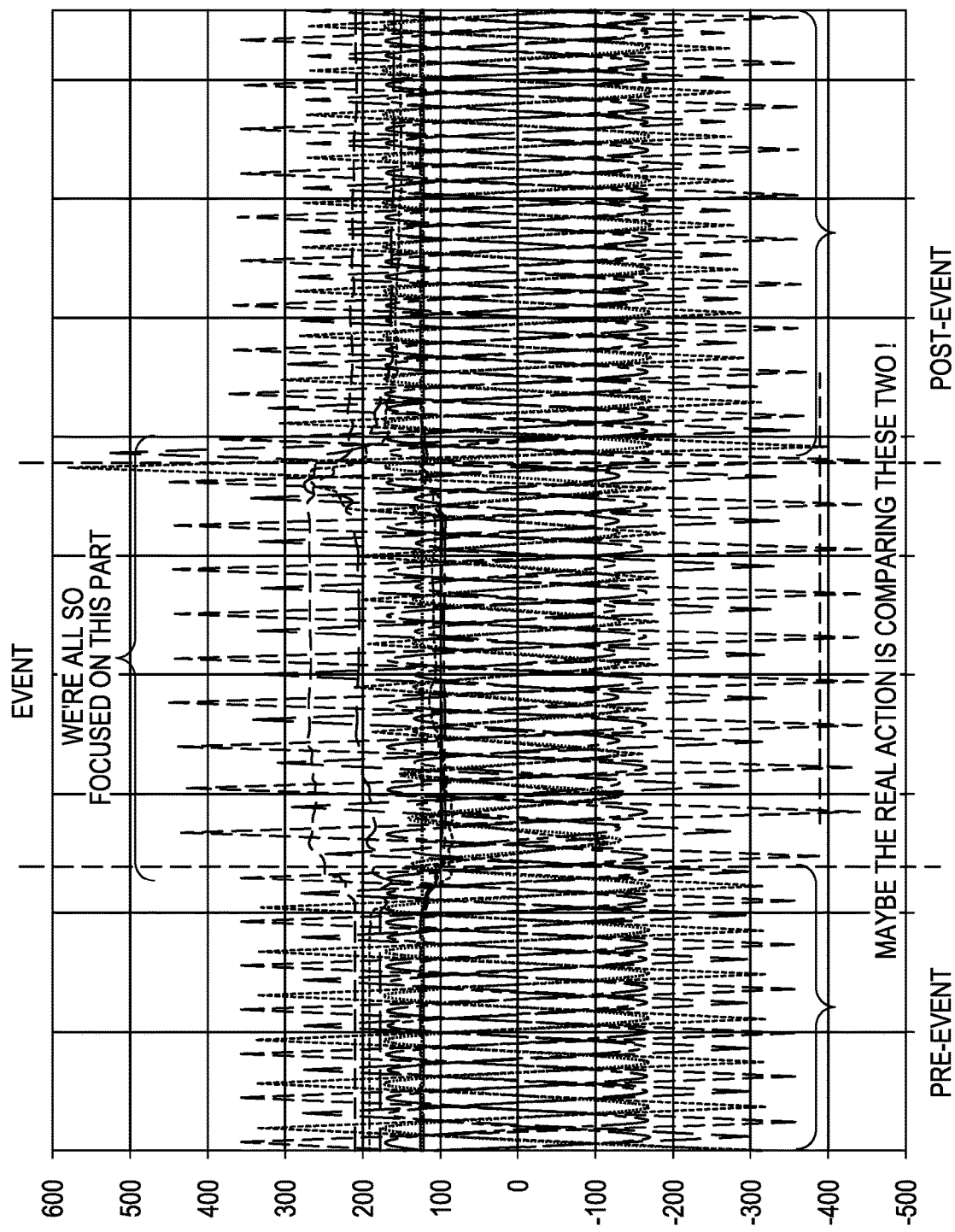
FIG. 2 illustrates example waveforms and calculated measurements of different voltage phases monitored on a multi-phase electrical/power system (e.g., a three-phase electrical/power system) in accordance with an exemplary embodiment of the present disclosure.

The measurement data captured during the event (e.g., the period from the start to end of the detected event or during the event) may be insufficient to fully understand the detected event (e.g., circumstances surrounding the event including underlying causes of the event). To improve event analysis, measurement data of the pre-event and post-event states of the electrical/power system may also be captured and analyzed to provide additional information and context for the detected event. An example of captured waveforms (e.g., measured or calculated) for a monitored voltage on a multi-phase electrical/power system is shown in FIG. 2. Once the pre-event, event and post-event measurement data is captured, the attributes of the pre-event, event and post-event data may be evaluated/analyzed to obtain additional information about the event, which may result in actions to be taken, such as by the power meter, protective device or other system. Furthermore, the captured, measured and derived data associated with a detected event (e.g., pre-event, event and post-event) may be tagged and reported in an event report, which is transmitted to other systems or devices or to the cloud.

In various example embodiments, electrical/power system measurements may be calculated from steady-state portions of a waveform before and after the event that triggered the capture. Pre-event data may be compared against post-event data to extract additional information about the event (e.g., evidence or metadata of capacitor bank switching, loss or addition of load or type of load, other changes in the electrical/power system or other information). The data from the steady-state portions of the waveform before and after a power event may provide additional information that may help determine (a) the cause of an event, and (b) the impact on equipment on the electrical/power system. For instance, the pre-event and post-event data may be isolated, and additional data may be derived (e.g., voltage/current/Power RMS may be calculated per phase or per aggregated phases, and each phase may include related data such as phase angles, phase shifts, line-to-line or phase-to-phase voltage(s), line or phase current(s), power factor, power, individual harmonics, and other characteristics). Statistical analysis of changes or variations in the measured or calculated data from pre-event to post-event may also be performed. Significant changes in one or more measurements may be correlated with impact on equipment on the electrical/power system (e.g., the operation of a capacitor bank, or loss or addition of a load or type of load following an event or other changes in the electrical/power system). The significance of a change may be determined using rules such as thresholds or conditions. The determined cause and impact are additional descriptive information, which may be stored as additional metadata about an event(s) or the electrical/power system and may be useful to higher level analysis.

Various representative parameters, characteristics and/or elements regarding the pre-event and post-event states may be measured or calculated (e.g., phase shift (or variation), magnitude of an electrical property, real/active/reactive power changes, harmonics, power factor, duration of the event or other pre-event/post-event parameters). Pre-event and post-event characteristics may be compared to ascertain additional information about or surrounding the detected event. For example, it may be possible to ascertain from the pre-event and post-event information (combined with other known or monitored information such as system and component information, etc.), the following: (i) if system components were energized or de-energized, (ii) which reactive characteristics of the load(s) (e.g., capacitive or inductive) was energized or de-energized when the power factor changes, (iii) if the load was stable when a capacitor bank was energized or de-energized, (iv) if a voltage phase shift occurred indicating a potential change in the sources (e.g., change between utility and generator), (v) a change in load balance, and (vi) a change in discrete or total harmonic distortion co-incident with a load(s) energizing or de-energizing (i.e., this may help identify electronic power supply generating motor protection trips/disturbances). Additional examples of analysis that may be performed include the following:

(1) If there is a change in the power factor (e.g., phase angle between $V_a$ and $I_a$) between pre-event and post-event, this scenario may indicate a capacitor bank energizing or de-energizing. The inference may be confirmed by the analysis of the waveform. Alternatively, this scenario may indicate something about the type of load added or removed from the system.

(2) If there is a change in total or the per phase current (e.g., change between the pre-event and post-event), this scenario may indicate load(s) added or removed from the system. This may indicate the operation of a protective device removing some percentage of the loads due to a downstream fault. In addition, this analysis may take into account other information (e.g., the location of certain components on the electrical/power system). The above are simply examples of enriched (e.g., additional) information that may be obtained by evaluating pre-event, event and post-event data. Other examples are provided in the Table of FIG. 11.

Figure 3:
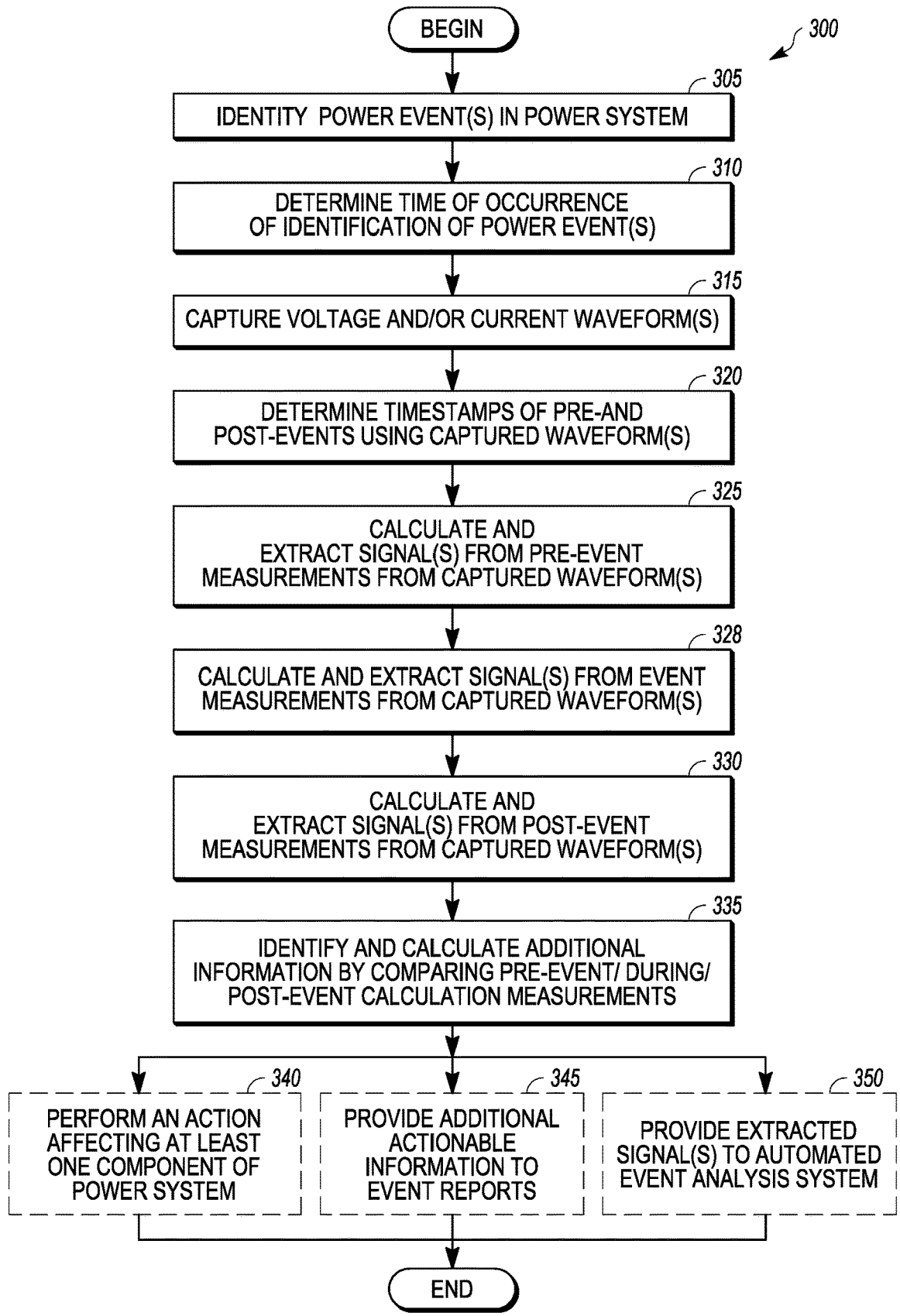
FIG. 3 illustrates a flow diagram of an example process by which waveforms of monitored electrical propert(ies) on an electrical/power system are captured and analyzed, and actions are taken according to the resulting waveform analysis in accordance with an exemplary embodiment of the present disclosure.

FIG. 3 illustrates a flow diagram of an example process 300 by which measurement data, such as voltage and current waveforms, of monitored electrical propert(ies) on an electrical/power system that are captured, analyzed and actions are taken according to the resulting waveform analysis (e.g., measurements, derivations and calculations). By way of example, the process 300 will be described below with reference to a computer system, such as an IED which is configured to monitor measurable electrical propert(ies) of an electrical/power system.

At reference 305, the IED identifies a power event(s) in the electrical/power system while monitoring the electrical/power system. At reference 310, the IED determines a time of occurrence of identification of the power event(s). At reference 315, the IED captures measurement data (e.g., waveform(s) of voltage and/or current signals or other measurable and/or derivable electrical property of the electrical/power system, which is monitored by the IED). The electrical measurements data may include data for each power phase of the electrical/power system (e.g., a single phase or multiphase electrical/power system). At reference 320, the IED determines timestamps of pre-event and post-event information using the captured waveform(s). An event duration may be determined from the pre-event and post-event time stamps (e.g., pre-event timestamp minus post-event timestamp may equal an event duration).

At reference 325, the IED extracts and calculates energy-related information such as for example energy-related signal(s) (e.g., voltage and current signals) from pre-event measurements from the captured waveform(s). At reference 328, the IED extracts and calculates energy-related information such as for example energy-related signal(s) from event measurements (e.g., during the event) from the captured waveform(s). At reference 330, the IED extracts and calculates energy-related signal(s) from post-event measurements from the captured waveform(s). At reference 335, the IED extracts and calculates additional information by comparing pre-event, event and post-event calculations, derivations and/or measurements. Examples of such calculations, derivations and/or measurements may include for example phase shifts (e.g., per half-cycle), changes in magnitude, changes in power factor, and/or other relevant power characteristics that may be determined from the waveform(s) within the constraints of the IED ascertaining said calculations, derivations and/or measurements. For clarity, some or all calculations may be performed within the software application, cloud-based application, gateway and/or other location/device/system remote from the IED extracting said energy-related signal(s).

After reference 335, the IED may perform an action affecting at least one component of the electrical/power system at reference 340, provide additional actionable information to event reports at reference 345, or provide extracted signal(s) to automated event analysis system at reference 350.

Although the process 300 is described with reference to an IED, the various operations may be distributed and performed across a plurality of different computer systems in communication with each other (e.g., over a network). Various operations in the process 300 may be performed in series or in parallel, such as for example the operations at references 325, 328 and 330. Furthermore, in addition to signal(s), the energy-related information may include energy-related parameter(s), indicator(s), status(es), and/or other information, which may be determined from the pre-event, event and post-event measurements, and used to determine additional information associated with the power event. Some examples can include AC and/or DC voltage signals, AC and/or DC current signals, power, distortion (e.g., harmonic/interharmonic), DC offsets, noise, discrete phase data (e.g., voltage and/or current phases), frequency, phase angles, the state or occurrence of load loss (e.g., Yes or No) which may reflect that something was added or removed to the system during the event, percentage of load loss, power factor change, changes in the steady state voltage/current shapes (e.g., harmonics and inter-harmonics changed) and/or other measured and/or derived information.

Figure 4A:
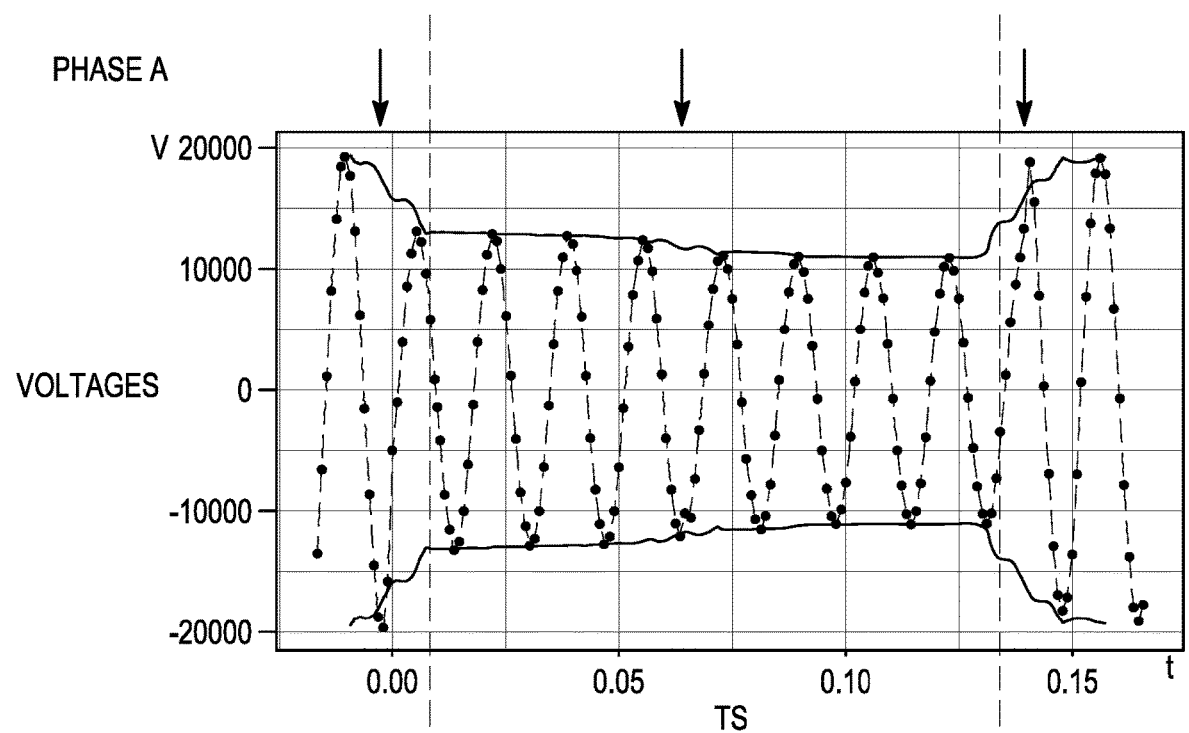
FIGS. 4A, 4B and 4C illustrate example waveforms of voltage monitored and captured for different phases A, B and C of an electrical/power system in accordance with an exemplary embodiment of the present disclosure
Figure 4B:
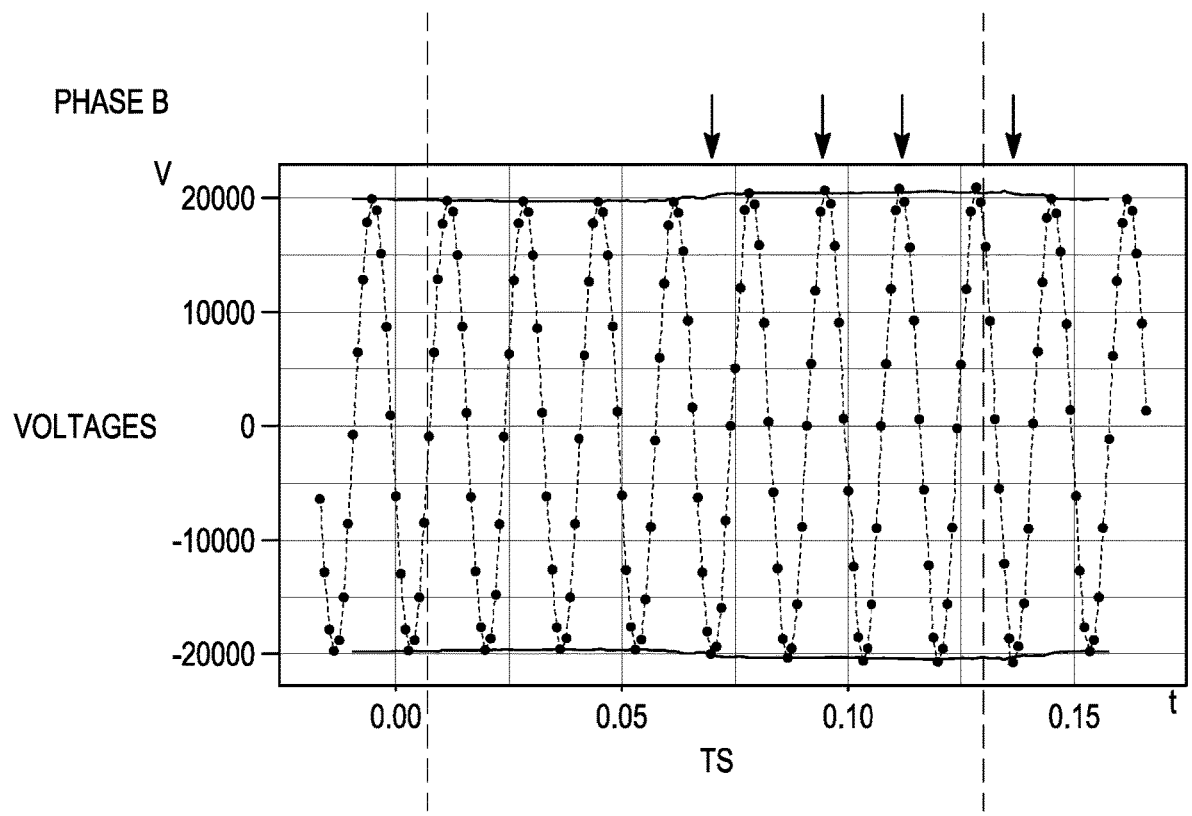
Figure 4C:
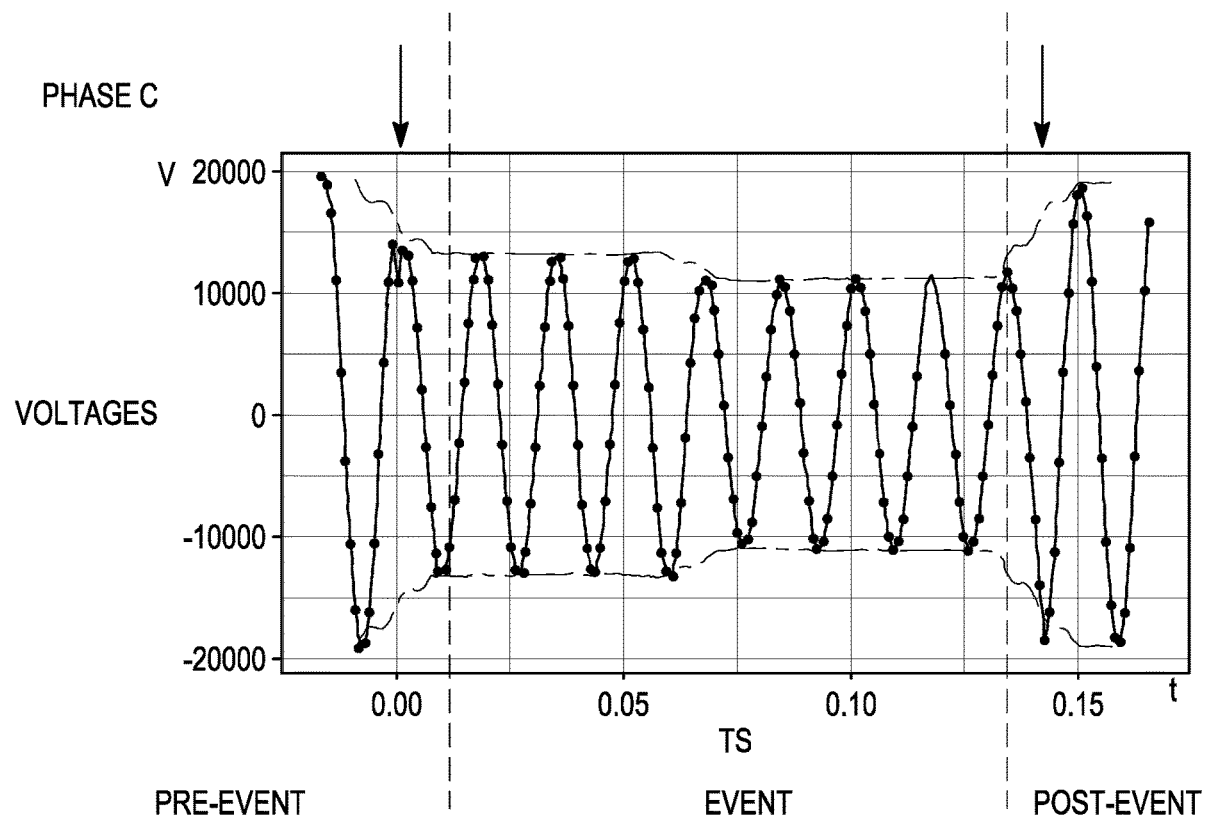

An example of measurements and calculations of waveforms for a polyphase electrical/power system, which are performed by an IED and/or other computer system, are described with reference to FIGS. 4A, 4B and 4C and FIG. 5A. FIGS. 4A, 4B and 4C illustrate example measurement data in the form of waveforms of voltage monitored and captured for different phases A, B and C of an electrical/power system. As shown, the captured waveforms on each phase A, B and C include pre-event, event and post-event measurement data. In this example, each of the voltage waveforms may be analyzed to determine additional information about the detected event on the electrical/power system by comparing characteristics discernable from the pre-event and post event measurement data (e.g., a phase shift). For example, the phase shift analysis may involve calculating the duration of each half-cycle of a waveform using the signal's zero-crossing to determine whether there are any significant variations in the duration of the half-cycles, (e.g., comparing the changes in the duration from a half cycle or n-half cycles where n is an integer 1, 2, . . . ) to the next for the waveform. If desired, a graph (or data) of duration versus half-cycle may be calculated/derived/generated for each waveform to compare and/or visualize the duration variations across the half-cycles of the waveform. As shown in FIGS. 4A, 4B and 4C, an initial determination of significant variations in the duration is highlighted (see, e.g., arrows) on the waveforms for phase A, B and C.

Figure 5A:
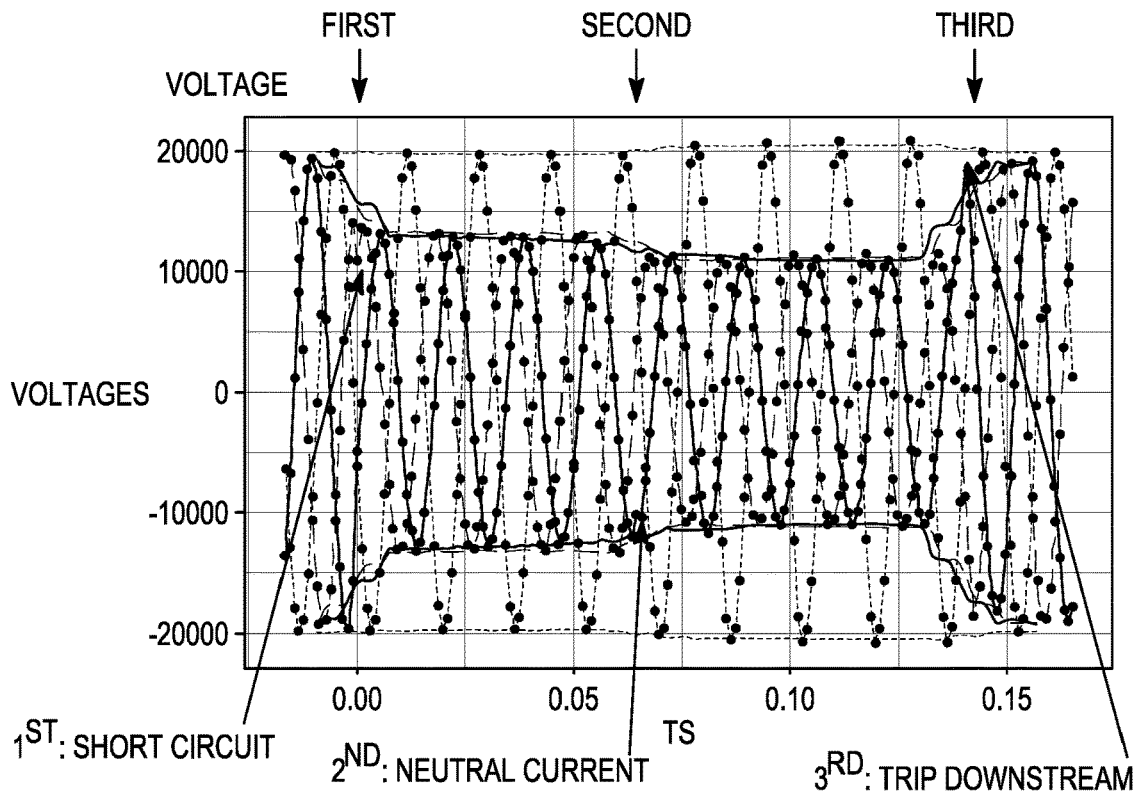
FIG. 5A illustrates example waveforms of the voltage and current monitored and captured for different phases A, B and C of an electrical/power system, which are provided for comparison with each other for waveform analysis in accordance with an exemplary embodiment of the present disclosure
Figure 5A:
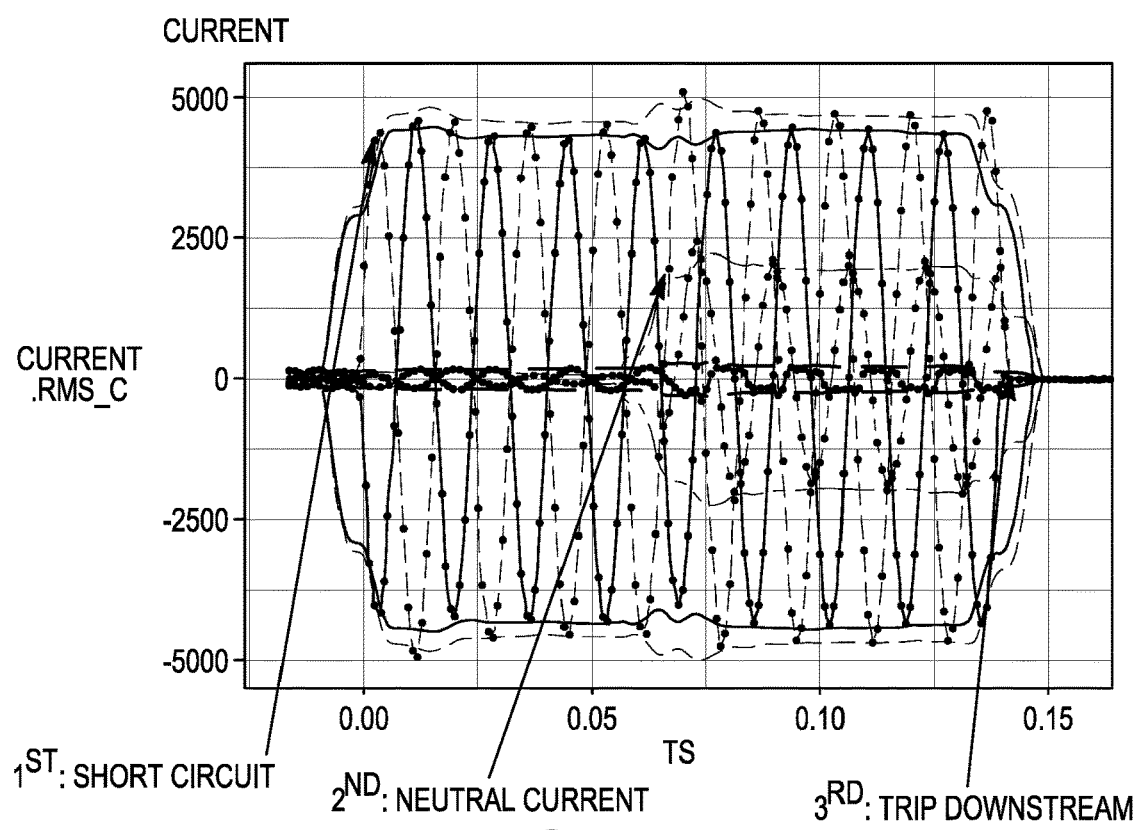

As shown in FIG. 5A, the voltage waveforms may be overlaid on each other and the most significant duration variations may be identified (e.g., if a duration variation occurs at the same time period in two or more of the phases or using other rules or conditions). This may be one approach to filter out less significant duration variations. In this example, there are three significant duration variations. The first occurs at the start of the event, the second occurs around the middle of the event, and the third occurs at the terminus of the event in the overlaid voltage waveforms. As further shown in FIG. 5A, the current waveforms of a given event may also be analyzed in a similar fashion as for voltage and may be overlaid as well. Time periods with the significant duration variations are also highlighted on the overlaid current waveforms for each phase and may identify periods of interest to evaluate where a change likely occurred. Based on a comparison of some of the representative parameters, characteristics and/or elements measured, derived and/or calculated from the voltage and current waveforms (including the pre-event, event and post-event measurements such as changes in magnitude, phase angle, half-cycle duration, power factor and other related electrical characteristics), it is possible to identify (in this example) that a short circuit occurred during a first highlighted time period, generation of a significant neutral current started from a second highlighted period during the event, and a trip occurred downstream during a third highlighted period.

Figure 5B:
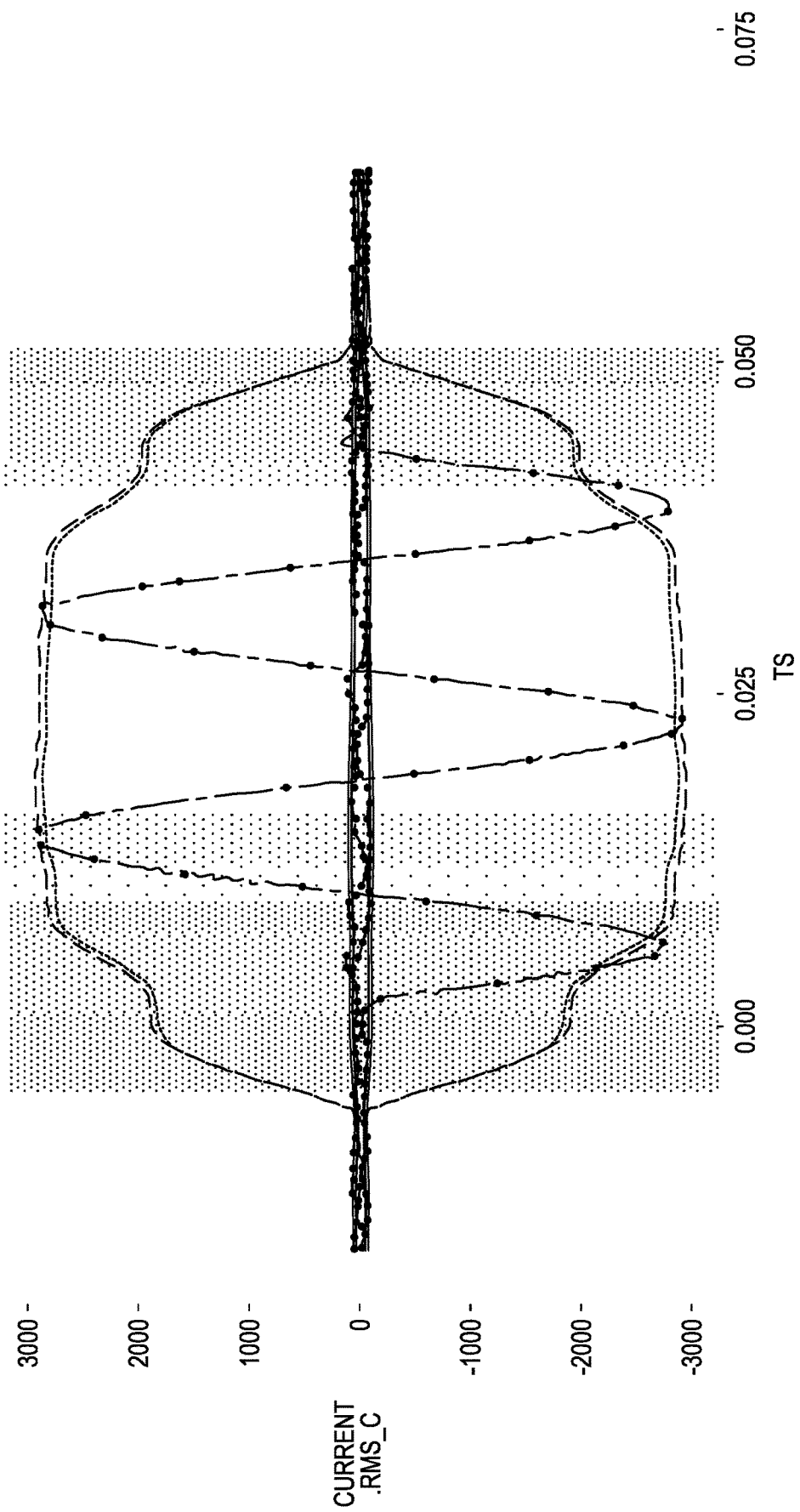
FIG. 5B illustrates another example of current waveforms of a current monitored and captured for different phases A, B and C of an electrical/power system, with pre-event, event, and post-event measurement data in accordance with an exemplary embodiment of the present disclosure

The above is simply an example of waveform analysis that takes into account pre-event, event, and post-event measurement data of voltage and/or current signals. Another waveform example for monitored current is shown in FIG. 5B for different phases A, B and C of an electrical/power system, with thirty-two (32) measurement data that may be analyzed. It should be understood that additional information may be obtained through analysis of the waveforms for one or more voltage and/or current signals or other measurable and/or derivable electrical propert(ies), parameters and/or representative characteristics (or perhaps "statistical/analysis dimensions" in data science terminology) including variations in electrical characteristics between the pre-event, event, and post-event periods on the electrical/power system.

In accordance with various example embodiments, the capture period before and after a detected event may also be predefined or changed to facilitate capture of the pre-event and post-event measurement data (e.g., waveform(s)) over a sufficient period (e.g., half-cycle, one cycle, one and a half cycle, two cycles, etc.) to avoid missing relevant data. This may be accomplished by determining a steady series of points in the measurement data before and after the event using (for example) RMS values of the waveform. In this way, relevant data reflecting variations in the waveform before and after the event are captured. The adjustment of the pre-event, event and post-event capture periods may be automated within the IED or other remote computer system. The desired period of the measurement data (e.g., waveform(s)) may be acquired from a real-time system, in-memory system, buffer, or other memory storing the monitored electrical propert(ies), parameters and/or characteristics (or statistical analysis elements and/or dimensions).

For example, the end of an event linked to the voltage signal may be tracked, and the impact attenuates so that a few cycles of the new normal "steady-state" behaviour may be captured. Sufficient post-event measurement data is captured to extract all the relevant signals. The steady-state of sampled points (e.g., a pseudo-consistent series of data points) before and after a detected event may provide a reference to determine a suitable capture period for the pre-event and post-event measurement data. In an electrical/power system, an extrapolation may be performed on the measured, calculated and/or derived electrical properties. As such, it is possible to extrapolate missing data with a varying degree of statistical and/or rules-based confidence. The feature of adjusting/correcting the capture period for a detected event may be automated at the IEDs or other computer system (e.g., a smart power meter).

2. Examples

Additional discussion is provided below with examples, including exemplary scenarios, to explain the usefulness of the various features described herein. These examples may be discussed with reference to an IED (e.g., a smart power meter, circuit breaker or other equipment or IEDs on the electrical/power system).

For example, a power meter may process and discretely measure, derive, log and store electrical properties on the electrical/power system, such as voltage and/or current signals or other measurable and/or derivable electrical property, using a high-speed data buffer. The power meter may then keep only the measurement data (e.g., waveform(s)) that are captured based on event detection. Events may be detected using absolute thresholds (e.g., absolute and/or relative voltage). The thresholds may be adapted and changed based on received data or other factors (e.g., either recognized standards, relative to the nominal voltage, or a site setting which may vary based on, for example, a critical application that needs monitoring). Sites that require increased sensitivity may use thresholds that are closer to the nominal voltage. Sites that are less stringent, may allow the thresholds to be set further from the nominal voltage. For example, for an insensitive process, the threshold may be set closer to 25% rather than triggering at 10% because that is where a potential risk of impact may lie. Thus, a power meter may be selectively configured to discretely measure, derive, and/or log and capture waveforms based on defined thresholds, triggers, and/or other parameters. The measured voltage and/or current signals (or derived parameters including RMS values) may be evaluated against a threshold to detect a start of an event and to initiate a waveform capture operation. This approach may be applied at different levels/layers with thresholds being applied for different levels/layers and may be an extension of alarm events.

A power meter(s) may act as a collection module for collecting data points (e.g., power event data and additional information), and may be provided at different locations, levels, zones or layers along a power distribution system (e.g. at data centers, hospital sub-systems, room levels, building levels, system levels). A power meter may collect reporting data from one or more locations, levels, zones or layers. The collected information, which may be further processed, may be sent to a compute or control network node. The power meter itself may also be configured to act as the compute or control network node and may be connected directly to the cloud. In a distributed network system architecture, analysis of pre-event, event, and post-event characteristics may occur at the meter, and the calculations and analysis may happen at any layer (e.g., at the meter, at an edge device, in the box, at the network monitoring level (e.g., a software tracking real time power on the system, or in the cloud), or the various operations may be distributed between different systems and devices in a network.

The analysis on each waveform is something that may optionally be localized. For example, analysis, interpretation, and/or models that are implemented at a system level may be communicated to the IED to implement locally. A digital repository may collect this information, and sort, store and/or utilize it in some manner. A library and/or digital repository may be provided for smart alarms as well as for thresholds. The waveform analysis may desegregate the dimensions of what happened before, during the event, and after the event. All three may be compared in digital repositories or against themselves. On detection of changes (e.g., what happened before, during and after), the signal between what was there before the event is compared to what happened/what is there after the event to determine additional information related to the detected event (e.g., actions surrounding the event such as source change, load loss or power interruption upstream or downstream, short circuit, reactive or inductive load, etc.).

Power meters may be employed to capture waveforms at different positions, levels, zones or layers for a site (e.g., a hospital or a university campus). For example, a main power meter may mirror the utility service meter, and other IEDs may be placed to capture and report data, including captured waveforms, for critical locations. The data provided by these power meters may be analyzed together, e.g., waveforms captured around a particular time period or event(s), to provide a more detailed picture of the state of the electrical/power system and of any detected event. The measured, captured, derived, and/or analyzed data also may be tagged by the power meter to facilitate processing thereof (e.g., a part of a phase, a type of associated waveform, voltage, current, power, reactive power, etc.), and also mapped to a particular position in the electrical hierarchy. Tags may also be employed to categorize priority, locality (e.g., local, zone, or system), and other relevant information. The power meters may be part of a larger monitoring system, which may be implemented through a cloud, to provide for event and alarm reporting by analyzing data from the power meters and other cloud services. The data collected from meters can, for example, be provided to the cloud or other network component for further processing, which may entail pooling, correlating and analyzing the data, and reporting the data to a user or other system. Updates may be pushed to the power meters for use in performing analysis of measurement data or data calculated therefrom.

It should be noted that power meters are simply provided as an example of an intelligent electronic device (IED), which may be configured to implement the operations described herein. Other computer systems or devices may likewise be configured to implement the operations described herein. For example, as used herein, an IED can be a computational electronic device optimized to perform a particular function or set of functions. Examples of IEDs can include smart utility meters, power quality meters, and other metering devices. IEDs may also be imbedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, and the like. For example, where the IED is an electrical power monitoring device, it may be coupled to (or be installed in) an electrical power distribution system and configured to sense and store data as electrical parameters representing operating characteristics (e.g., voltage, current, waveform distortion, power, etc.) of the power distribution system. These parameters and characteristics may be analyzed by a user to evaluate potential performance, reliability or power quality-related issues. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED In some embodiments, the term "IED" as used herein may refer to a hierarchy of IEDs operating in parallel and/or tandem. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software.

III. Event Profile Creation

In accordance with a further embodiment, a profile library of normal operations and/or typical power events may be built by capturing and analyzing measurement data (e.g., waveforms) of voltage and/or current signals or other measurable/derivable electrical properties during normal operations of the electrical/power system (e.g., when no power or disturbance event is detected). For example, waveforms may be captured on a regular basis which are not linked or triggered by any event to have appearing behaviours on each dimension/measurement to identify over a longer learning period all the encountered and distinct Power Quality (PQ) profiles. This is a way to build a site and/or meter specific libraries of occurring "PQ profiles".

Once learned and analyzed (e.g., sent to the meters or as driven by the system), these PQ profiles may be used to trigger new waveform captures on new possible profiles. For example, a new steady-state profile may be detected if actual voltage and/or current wave-shapes deviate from all the known profiles in the digital repository. As such, it is not necessary to constantly capture all the measurements, derivations, and values. Furthermore, each new profile is automatically analysed to perform classification of this new steady-state. Any new profile may be used to conduct risk or impact analysis, and to enable for example predictive and preventative analytics and services. The new profile also may be analyzed with respect to other profiles that may be correlated in time or dimension to predict whether the electrical/power system is moving slowly or fast towards an abnormal state of operation (e.g., a power event).

Figure 6:
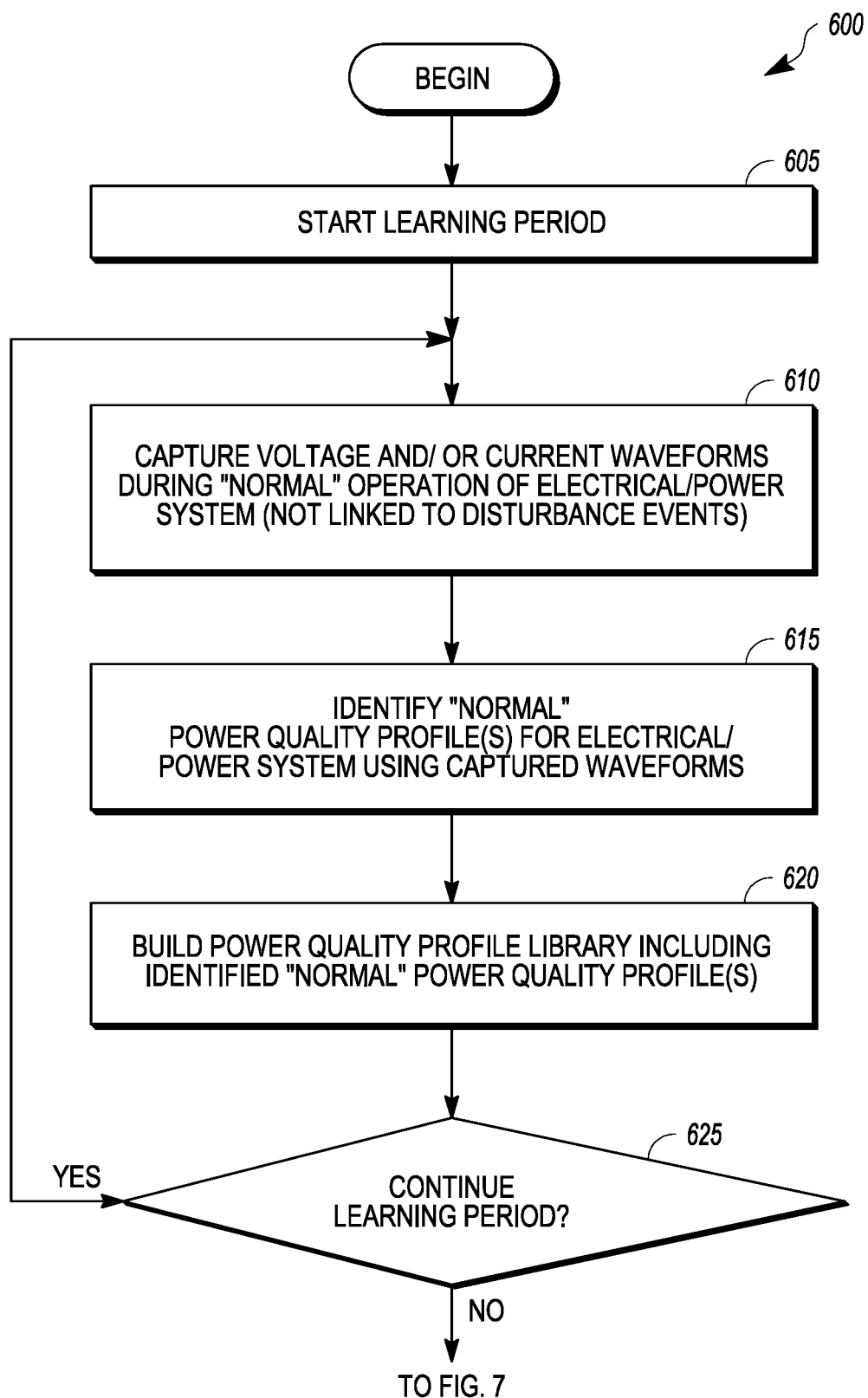
FIGS. 6 and 7 illustrate an example process by which electrical propert(ies) on an electrical/power system are monitored to identify and create event profiles of normal operations on the electrical/power system, and to store the power event profiles in a digital repository (e.g., library) in accordance with an exemplary embodiment of the present disclosure
Figure 7:
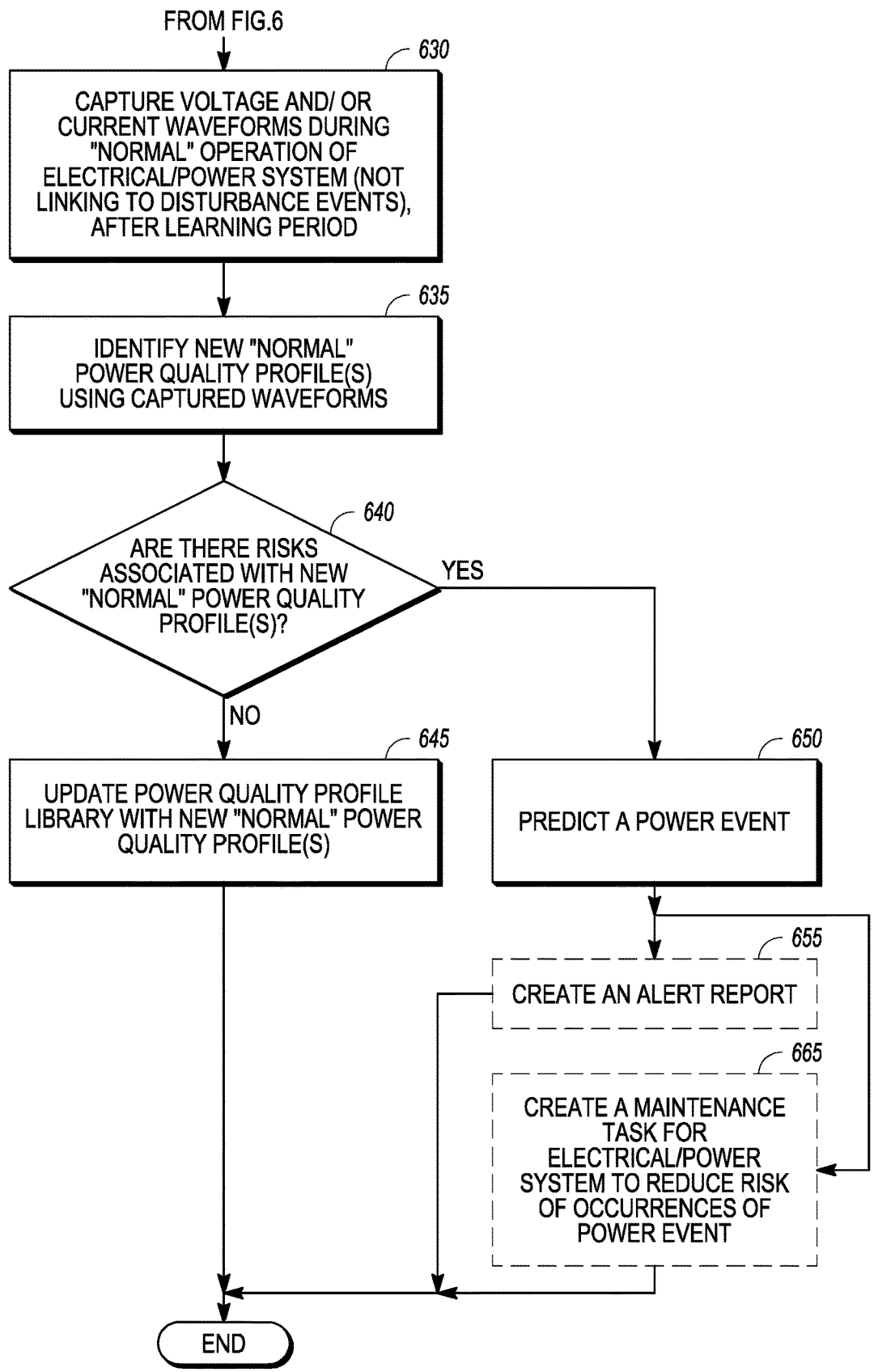

FIGS. 6 and 7 illustrate an example process 600 by which electrical propert(ies) on an electrical/power system are monitored to identify and create event profiles of normal operations on the electrical/power system, and to store the power event profiles in a digital repository. By way of example, the process 600 will be described below with reference to a computer system (e.g., an IED), which is configured to monitor and measure electrical propert(ies) of an electrical/power system.

As shown in FIG. 6, the IED starts a learning period at reference 605. At reference 610, the IED captures voltage and/or current signals or other measurable and/or derivable electrical property during normal operation of the electrical/power system (e.g., no detected power events or links to power events).

At reference 615, the IED identifies "normal" power event profile, e.g., a power quality (PQ) profile(s), for the electrical/power system using the captured waveforms. The event power profile represents a typical power event on the electrical/power system.

At reference 620, the IED builds a digital repository of "typical power event profile" (e.g., a power quality profile digital repository including identified typical power quality profile(s)).

At reference 625, the IED determines whether to continue the learning process. If so, the process 600 proceeds back to reference 610. Otherwise, the process 600 proceeds to reference 330 as shown in FIG. 7. At reference 630, the IED captures voltage and/or current signals or other measurable and/or derivable electrical property (e.g., waveform(s), during normal operation of the electrical/power system when there are no detected power events or links to power events).

At reference 635, the IED identifies new "normal" power event profile (e.g., a typical power quality (PQ) profile(s)) for the electrical/power system using the captured waveforms. The event power profile represents a power event of normal operation on the electrical/power system.

At reference 640, the IED determines whether there are risks associated with the new "normal" power quality profile(s). If there are no risks, the IED updates the power quality profile digital repository with the new "normal" power quality profile(s). Otherwise, if there are risks, the IED predicts a power event at reference 650. After reference 650, the IED may create an alert report at reference 655 or create a maintenance task for the electrical/power system to reduce the risk of occurrence of the power event.

The process 600 or operations thereof may be initiated at random or at predefined time periods or under certain electrical property conditions (e.g., a higher or lower voltage, current, power, etc.) on the electrical/power system to sample a desired number of waveforms over time under different circumstances on the electrical/power system or facilities powered by the electrical/power system.

IV. Adjustable Pre-Event and Post-Event Capture Periods

In accordance with an exemplary embodiment, the pre-event and post-event capture period may be adjusted by analyzing and comparing the pre-event and post-event measurement data (e.g., waveform(s), for voltage and/or current signals or other measurable and/or derivable electrical property). To determine a pre-event capture period, an earliest time (e.g., an earliest timestamp) before an event detection is determined from the pre-event waveforms for voltage and/or current signals or other measurable and/or derivable electrical property before significant variations occur. To determine a post-event capture period, a longest time after detection of a terminus of the event is determined from the post-event waveforms for voltage and/or current signals or other measurable and/or derivable electrical property after significant variations have occurred. Thus, the pre-event capture period may be adjusted to a period between the earliest time to the time the event is detected as starting, and the post-event capture period may be adjusted to a period between the time the event is detected as ending and a time afterwards when no significant variations have occurred. In some cases, these capture periods may be extended to the next half-cycle or full-cycle.

A significant variation may be determined according to threshold conditions (e.g., outside a certain range such as outside ±10%, ±20%, etc. of a nominal value or a steady-state value for the electrical property). The pre-event and post-event capture period analysis may be performed across a plurality of power phases and measured and/or derived electrical properties to determine sufficient pre-event and post event capture periods to reduce or minimize the possibility of missing significant waveform data before and after a detected event period.

Figure 8A:
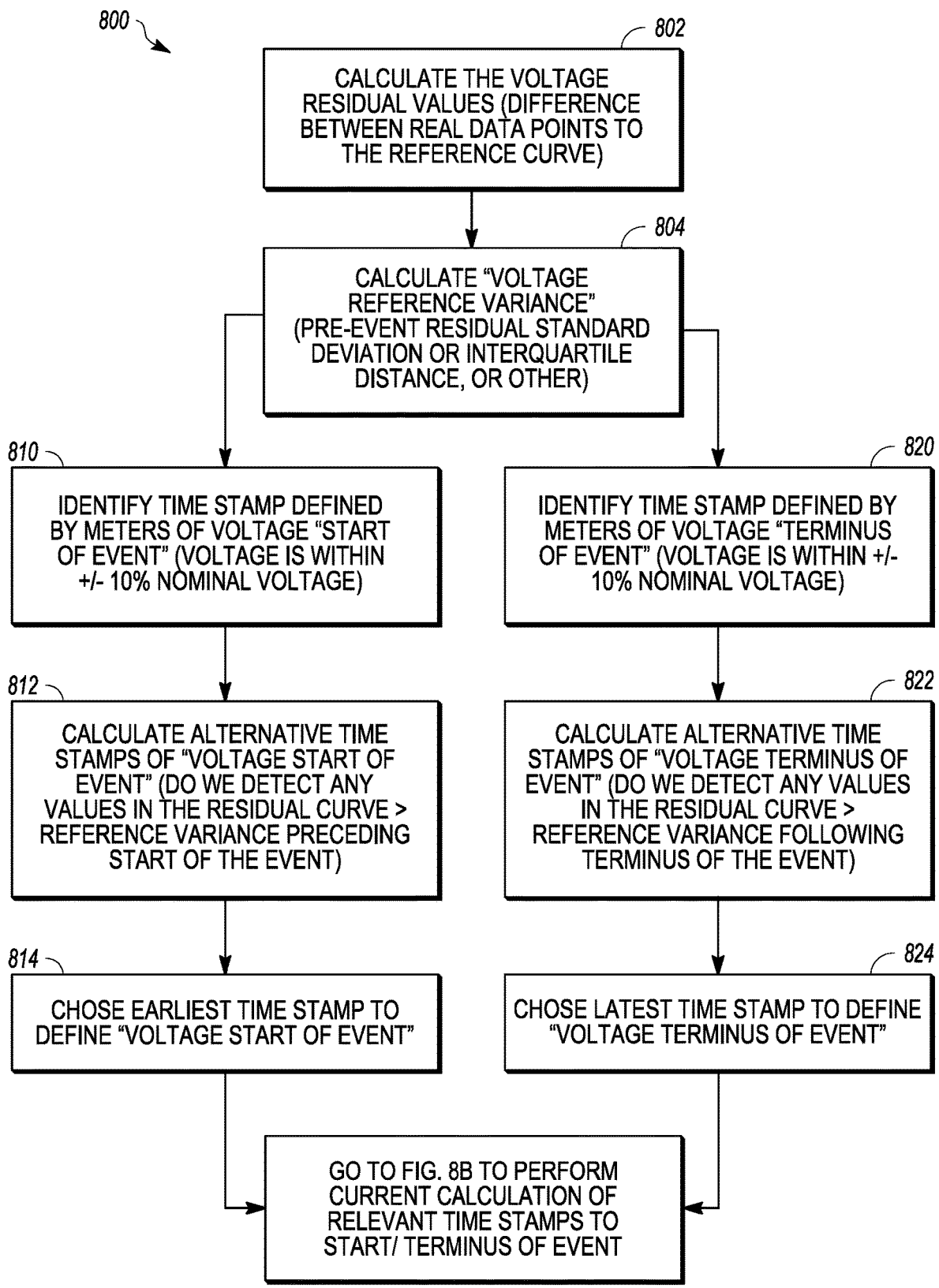
FIGS. 8A, 8B and 8C illustrate a flow diagram of an example process by which measurement data (e.g., waveform data) is analyzed to adjust the pre-event and/or the post-event capture periods in accordance with an exemplary embodiment of the present disclosure
Figure 8B:
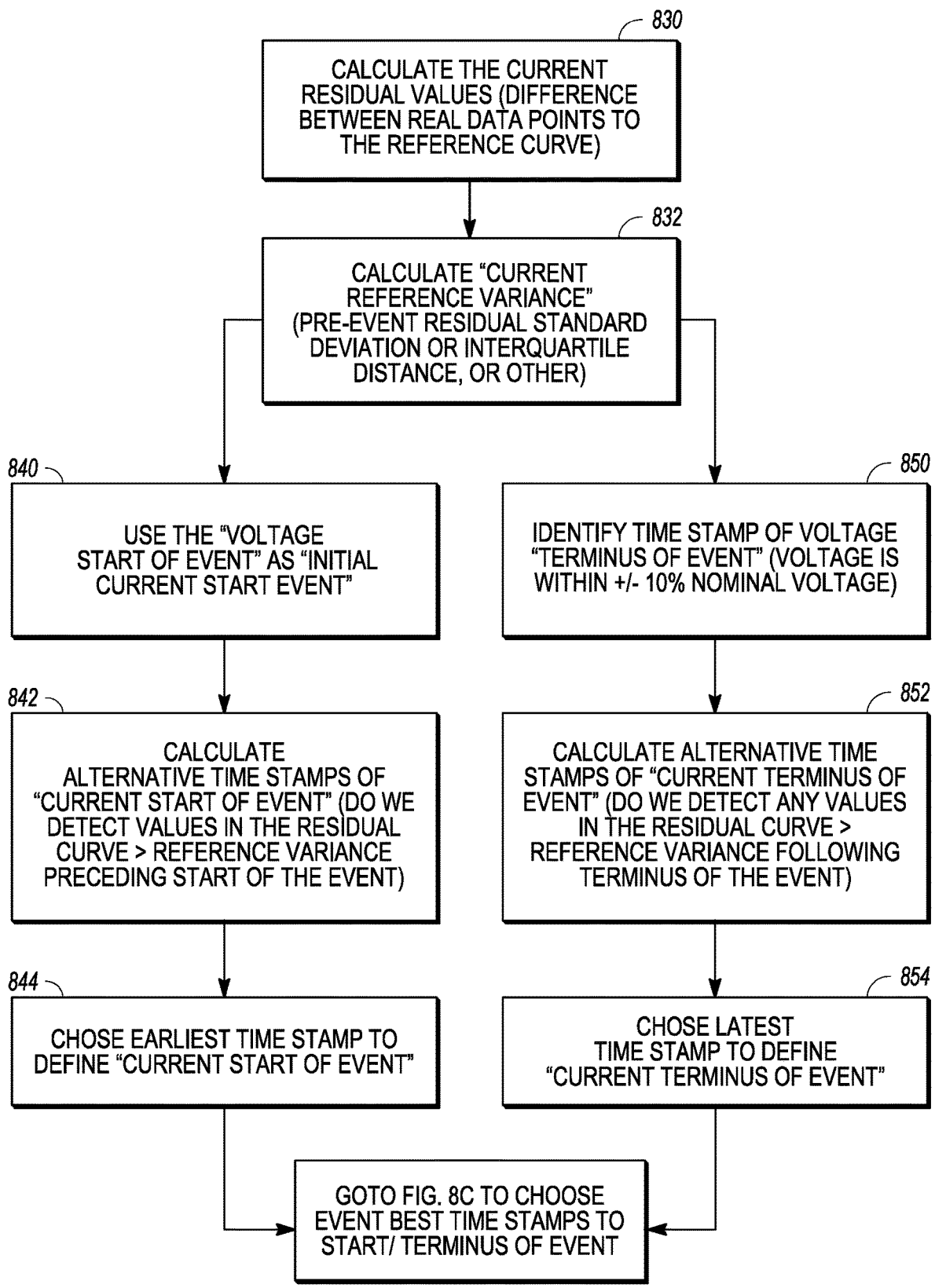
Figure 8C:
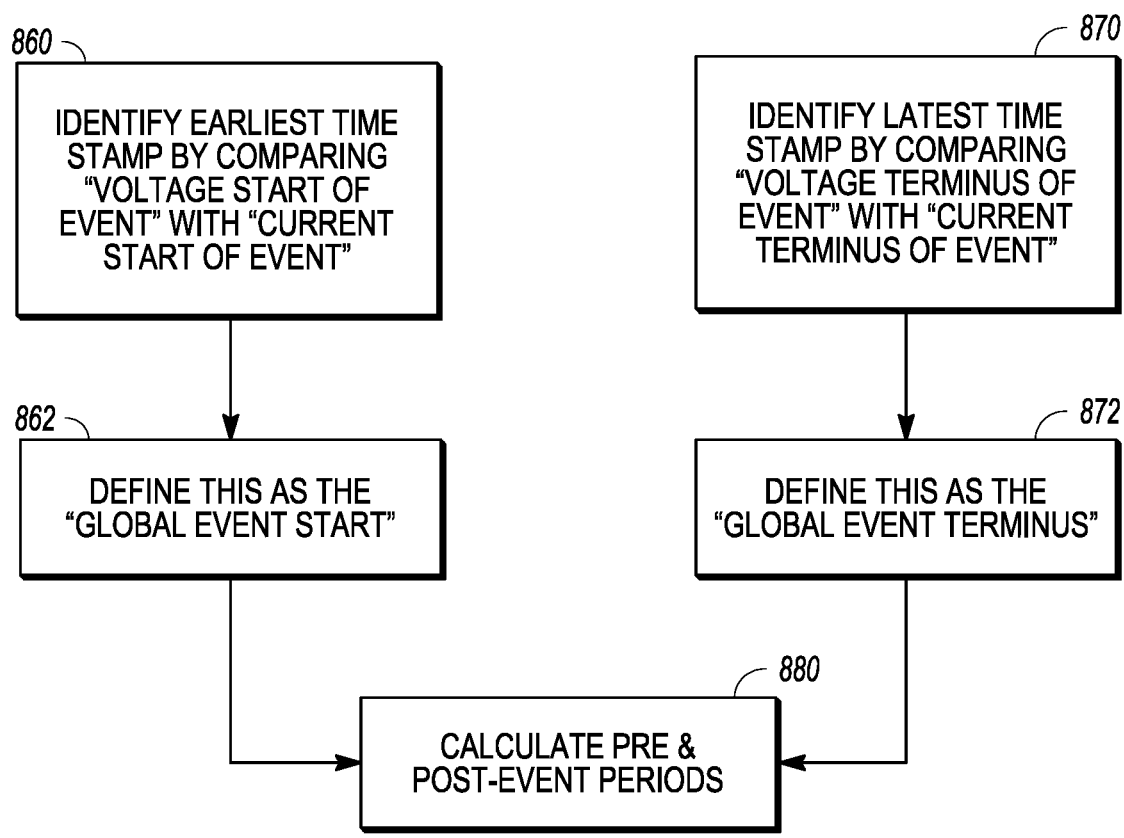

FIGS. 8A, 8B and 8C illustrate a flow diagram of an example process 800 by which waveform data is analyzed to adjust the pre-event and/or the post-event capture periods. By way of example, the process 800 will be discussed with reference to a computer system (e.g. an IED) for explanation purposes.

At reference 802, voltage residual values are calculated by the IED. The voltage residual values may be a difference between real data points of a measured voltage waveform to a reference curve.

At reference 804, voltage reference variation of the measured waveform is calculated by the IED. The variance of a pre-event residual voltage waveform may be a standard deviation, or interquartile distance, or another determinable variance.

At reference 810, a timestamp of a start of a voltage event (e.g., exceeding an event threshold) is detected by the IED The IED may be configured to detect a voltage threshold start of an event when a threshold condition is satisfied (e.g., voltage is within ±10% of nominal voltage). At reference 812, an alternative timestamp(s) of a start of a voltage event is calculated by the IED. For example, the IED detects values in the residual curve that are greater than the reference variance preceding the start of the voltage event. At reference 814, the IED selects an earliest timestamp to define the start of the voltage event.

Similarly, at reference 820, a timestamp of a voltage threshold end of an event is detected by the IED The IED may be configured to detect a voltage threshold end of an event when a threshold condition is satisfied (e.g., voltage is less than ±10% of nominal voltage). At reference 822, an alternative timestamp(s) of a voltage end of a voltage event is calculated. For example, the IED identifies any values in the residual curve that are greater than the reference variance at the terminus of the voltage event. At reference 824, the IED selects a latest timestamp to define the terminus of the voltage event.

After references 814 and 824, the process 800 analyzes the current waveform(s) to determine relevant timestamps for the start/terminus of the current events as further shown in the operations described in FIG. 8B. As shown in FIG. 8B, at reference 830, the IED calculates the current residual values (e.g., residual values for current). The residual values may reflect a difference between real data points of the current waveform to the reference curve. At reference 832, current reference variation of the measured waveform is calculated. The variance of a pre-event and/or post-event residual current waveform may be a standard deviation, or interquartile distance, or another determinable variance.

At reference 840, the IED uses the voltage start of event as an initial current start of event. At reference 842, the IED calculates an alternative timestamp(s) of a start of a current event. For example, the IED detects for any values in the residual current curve that are greater than reference variance preceding the threshold start of the event. At reference 844, the IED selects an earliest timestamp to define a current start of the event.

Similarly, at reference 850, the IED uses the voltage terminus of the event as an initial current terminus of the event. At reference 852, the IED calculates an alternative timestamp(s) of an end of a current event. For example, the IED detects any values in the residual curve that are greater than reference variance following the terminus of the event. At reference 854, the IED selects a latest (or later) timestamp to define a current terminus of the event.

After the references 844 and 854, the process 800 selects event best timestamps for the start/terminus of the event as shown in the operations in FIG. 8C. For example, as shown in FIG. 8C, at reference 860, the IED identifies an earliest timestamp by comparing the voltage start of event with the current start of event. At reference 862, the IED defines the identified earliest timestamp as the Global event start. Likewise, at reference 870, the IED identifies a latest timestamp by comparing the voltage terminus of the event with the current terminus of the event. At reference 872, the IED defines the latest (or later) timestamp as the Global event terminus (e.g., "end of event"). Once the Global event start and terminus are defined, the TED may calculate the pre-event period and the post-event period at reference 880.

The example process 800 may assume the residual voltage curve will reflect any time glitches as well (which may be checked by calculations). There is a simple explanation for such an assumption. For example, the sampling frequency may be fixed, which may be a setting of the IED (e.g., meter or measuring device). As such, if the real curve of measured points "shifts earlier" or "shifts later" (versus the "reference sine wave"), then the residual voltage values will increase or decrease because the residual voltage measures the distance to the normal point as defined within a normal sine wave.

Although FIGS. 8A-8C describes an example in which the Global event end and start for a waveform capture period is determined by evaluating current and voltage, other derivable electrical properties (e.g., power) or combinations thereof may be analyzed to determine or adjust the pre-event and post-event capture periods.

V. Phase Shift or Duration Analysis

The measurement data (e.g. waveform(s)) may be analyzed to determine a phase shift or change, which may provide additional information relating to a detected event. To perform such analysis, the waveform(s) may be analyzed by evaluating zero-crossing to determine a duration of each half-cycle of a waveform to adjust a pre-event or post-event capture period. From the duration information, it is possible to identify significant or relevant phase shifts that may reflect some change in the electrical/power system, and thus, should be evaluated or analyzed in greater detail. It is also possible to determine whether a shift of the zero crossings from pre-event to post-event reflects a change in the power source.

Figure 9A:
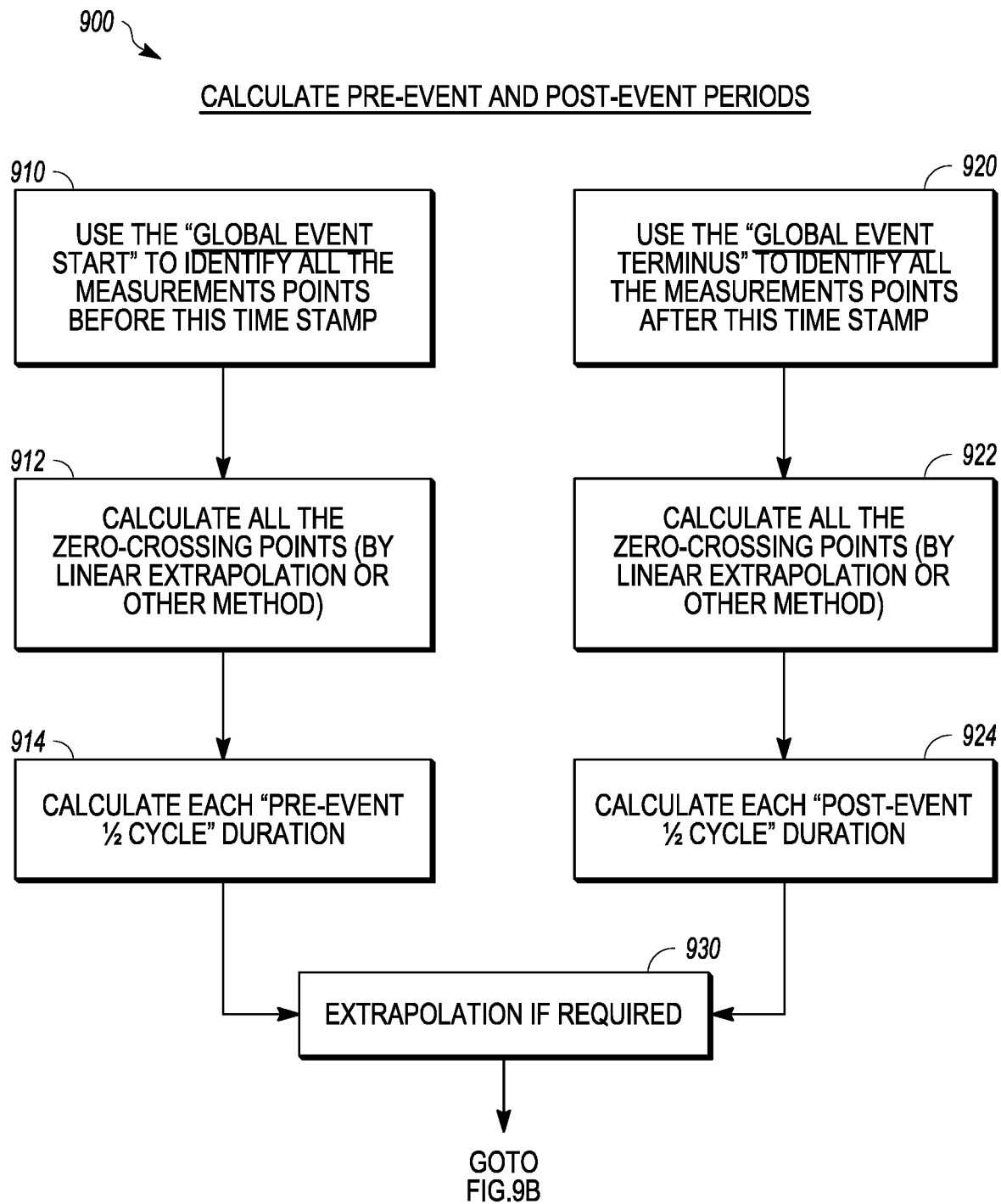
FIGS. 9A and 9B illustrate a flow diagram of an example process by which pre-event and post-event periods may be calculated for FIG. 8C in accordance with an exemplary embodiment of the present disclosure
Figure 9B:
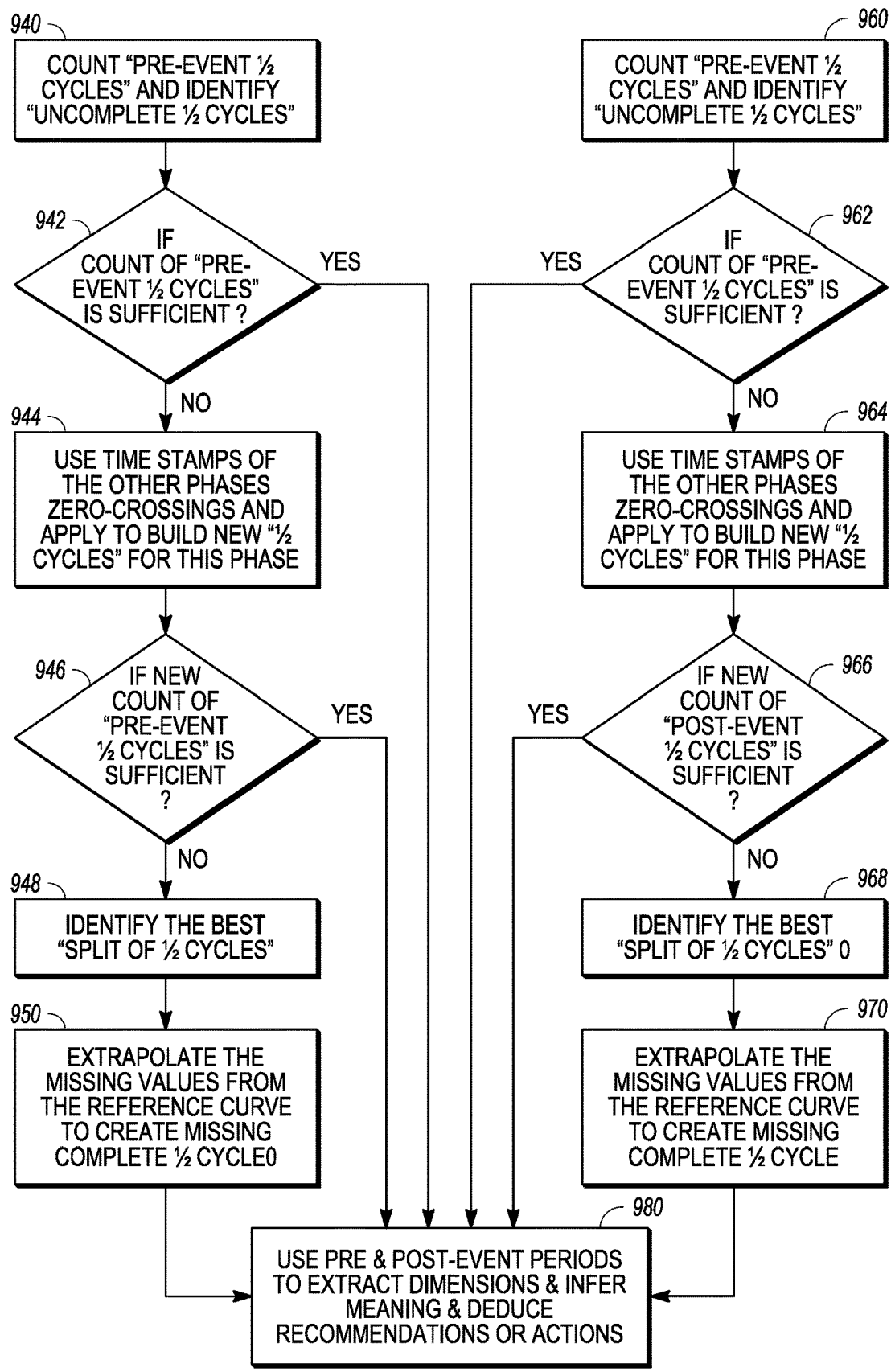

FIGS. 9A and 9B illustrate a flow diagram of an example process 900 by which pre-event and post-event periods may be calculated (e.g., 880 of FIG. 8C). By way of example, the process 900 will be described with reference to an IED for the purposes of explanation.

At reference 910, the IED uses the Global event start to identify the measurement points before the timestamp. At reference 912, the IED calculates the zero-crossing points (e.g., using linear extrapolation or other mathematical approaches). At reference 914, the IED calculates half-cycle duration for each pre-event.

At reference 920, the IED uses the Global event end to identify the measurement points after the timestamp. At reference 922, the IED calculates the zero-crossing points (e.g., using linear extrapolation or other mathematical approaches). At reference 924, the IED calculates half-cycle duration for each post-event.

At reference 930, the IED may perform extrapolation, if required, after references 914 and 924. The process 900 thereafter proceeds to the operations on FIG. 9B. For example, as shown in FIG. 9B, the IED counts pre-event half-cycles and identifies any incomplete half-cycles at reference 940. At reference 942, the IED determines whether the count of pre-event half-cycles is sufficient (e.g., greater than the minimum quality indicator, which starts for example as two and a half (2½) cycles) at reference 944. If so, the process 900 proceeds to reference 980 where the IED may use the pre-event and post-event period to extract dimensions, infer meaning and deduce recommendations or actions (e.g., after the pre-event and post-event half-cycle counts are sufficient or after extrapolation of missing values). These operations may for example be performed according to predefined rules.

If not sufficient at reference 942, the IED may use timestamps of the other phases' zero-crossings and apply them to build new half-cycles for this phase at reference 944. At reference 946, the IED determines whether a new count of pre-event half-cycles is sufficient. If the new count is sufficient, the process 900 proceeds to reference 980. Otherwise, if the count is not sufficient at reference 946, the IED identifies the best split of half-cycles at reference 948. At reference 950, the IED extrapolates the missing values from the reference curve to create missing complete half-cycle and proceeds to the operation in reference 980. A warning may be provided that the analysis is employing extrapolated data.

The above operations may likewise be performed for the post-event side. For example, turning to reference 960, the IED counts post-event half-cycles and identifies any incomplete half-cycles. At reference 962, the IED determines whether the count of post-event half-cycles is sufficient. If the count is sufficient, the process 900 proceeds to reference 980 where the IED may use the pre-event and post-event period to extract dimensions, infer meaning and deduce recommendations or actions (e.g., after the pre-event and post-event half-cycle counts are sufficient or after extrapolation of missing values). For example, these operations may be performed according to predefined rules.

If the count is not sufficient at reference 962, the IED may use timestamps of the other phases' zero-crossings and apply them to build new half-cycles for this phase at reference 964. At reference 966, the IED determines whether a new count of post-event half-cycles is sufficient. If so, the process 900 proceeds to reference 980. Otherwise, if the count is not sufficient at reference 966, the IED identifies the best split of half-cycles at reference 968. At reference 970, the IED extrapolates the missing values from the reference curve to create missing complete half-cycle, and then proceeds to the operation in reference 980. As previously noted, a warning may be provided that the analysis is employing extrapolated data.

At reference 980, once a sufficient pre-event and post-event period is captured for a waveform(s), the IED may perform various analysis and actions, locally or in combination with a remote device or system. For example, the IED may extract dimensions related to the event, detect a shift of the zero-crossings, detect for significant changes in duration of a half-cycle, and perform other analysis and actions described herein.

VI. Computer System

Figure 10:
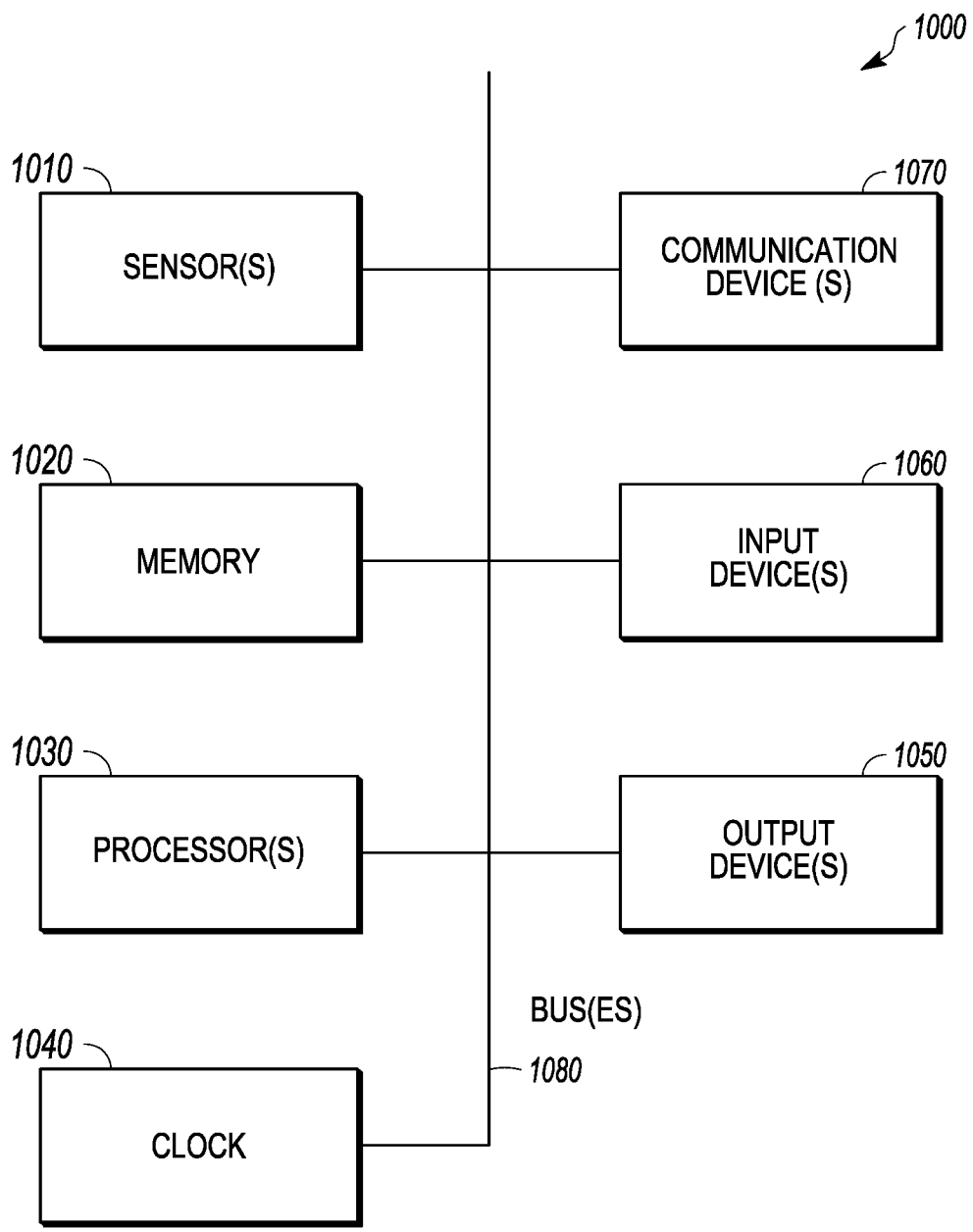
FIG. 10 illustrates a block diagram of example components of a general computer system (e.g., an intelligent electronic device (IED) or other computer system in accordance with an exemplary embodiment of the present disclosure)

As shown in FIG. 10, a computer system 1000 (e.g., IED) may include for example one or more sensors 1010, memory 1020, processor(s) 1030, clock 1040, output device 1050, input device 1060, communication device 1070, and a bus system 1080 between the components of the IED In various embodiments, the sensors 1010 may be configured to sense voltage and/or current signals or other measurable and/or derivable electrical property from power lines on an electrical/power system. The sensors 1010 may include signal processing and conditioning circuitry to measure energy-related signals (e.g., voltage or current signal waveforms) that are representative of the voltage and/or current signals or other measurable and/or derivable electrical property on the electrical/power system. The clock 1040 may be used to time-stamp measurement data, event data, event profile data, or other types of data which is measured, calculated, captured, stored or generated by the IED.

The memory 1020 may store computer executable code, programs, software or instructions, which may control the operations when executed by a processor, such as described herein. The memory 1020 may also store other data used by the computer system 1000 or components thereof to perform the operations described herein. The other data may include but is not limited to a digital repository of typical power events (e.g., power quality events, typical power events, atypical power events or other related events), a digital repository of typical non-event profiles, alarm events, thresholds, status(es) and/or measurement data (e.g., captured waveforms, parameters and thresholds, and other data discussed herein). The memory 1020 may also include a temporary storage (e.g., buffer(s)) to enable discrete logging of measured and/or derived data so that a desired amount of measurement data (e.g., waveforms) may be measured, derived, captured and/or stored.

The input device(s) 1060 and output device(s) 1050, for example, may include a keyboard or pad, mouse, trackball, microphone, touch screen, a printing device, display screen, speaker, etc. For example, the output device(s) 1050 may render information for external presentation (e.g., a display device) and input devices may accept information from external sources (e.g., users and other systems).

The processor(s) 1030, which interacts with the other components of the computer system, is configured to control or implement the various operations described herein. These operations may include monitoring, measuring, and/or deriving electrical parameters on an electrical/power system, waveform capture (WFC), event analysis, event profile creation, and other IED operations (e.g., metering, calculating, alarming, reporting, controlling, and so forth). The energy-related signals (e.g., a voltage or current waveform) may be sampled at a desired rate to obtain sufficient resolution of the data for calculation or analysis (e.g., 32 samples/cycle or 2048 samples/cycle).

The above describes example components of a computer system (e.g., an IED or network node). The IED or network node may be a power meter, circuit breaker, and/or other computer or smart systems/devices that may report event data to other computer systems and devices (e.g., a control node or central monitoring system on the network) for further analysis and action.

It should also be understood that the example embodiments disclosed and taught herein are susceptible to numerous and various modifications and alternative forms. Thus, the use of a singular term, such as, but not limited to, "a" and the like, is not intended as limiting of the number of items. Furthermore, the naming conventions for the various components, functions, characteristics, thresholds, parameters, and/or elements used herein are provided as examples, and may be given a different name or label. The use of the term "or" is not limited to exclusive "or," but may also mean "and/or". The use of the slash symbol "/" may mean "or" or "and/or".

It will be appreciated that the development of an actual, real commercial application incorporating aspects of the disclosed embodiments will require many implementation specific decisions to achieve the developer's goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

Using the description provided herein, the example embodiments may be implemented as a machine, process, or article of manufacture by using standard programming and/or engineering techniques to produce programming software, firmware, hardware or any combination thereof.

Any resulting program(s), having computer-readable program code, may be embodied on one or more computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable medium or in any transmitting medium which transmits such a program.

A processor(s) or controller(s) as described herein may be a processing system, which may include one or more processors, such as CPU, GPU, controller, FPGA (Field Programmable Gate Array), ASIC (Application-Specific Integrated Circuit) or other dedicated circuitry or other processing unit, which controls the operations of the devices or systems, described herein. Memory/storage devices may include, but are not limited to, disks, solid state drives, optical disks, removable memory devices such as smart cards, SIMS, WIMs, semiconductor memories such as RAM, ROM, PROMS, etc. Transmitting mediums or networks include, but are not limited to, transmission via wireless communication (e.g., Radio Frequency (RF) communication, Bluetooth®, Wi-Fi, Li-Fi, etc.), the Internet, intranets, telephone/modem-based network communication, hard-wired/cabled communication network, satellite communication, and other stationary or mobile network systems/communication links.

Furthermore, the capture, analysis, profile creation, reporting and other operations may be performed at a network node, such as a power meter or other equipment associated with or on the power distribution network, or performed across multiple network nodes in a distributed and hierarchical fashion to facilitate monitoring and analysis of power quality throughout the electrical/power system (e.g., utility and facilities) and to implement reporting and actions accordingly to improve or maintain the power quality.

While particular embodiments and applications of the present disclosure have been illustrated and described, it is to be understood that the present disclosure is not limited to the precise construction and compositions disclosed herein and that various modifications, changes, and variations may be apparent from the foregoing descriptions without departing from the invention as defined in the appended claims.

The invention claimed is:

1. A method of analyzing power events in an electrical power system using at least one processor and sensor, the method comprising:
monitoring at least one of a voltage and current signal in the electrical power system;
identifying at least one power event in the electrical power system from the monitored at least one of the voltage and current signal;
in response to identifying the at least one power event, capturing waveforms of the monitored at least one of the voltage and current signal from a first-time period before a start of the at least one identified power event to a second-time period after a terminus of the at least one identified power event;
determining energy-related information from pre-event measurements using the captured waveforms, the determined energy-related information from pre-event measurements including at least one of energy-related parameter(s), a signal(s), an indicator(s), a status(es), and other information;
determining energy-related information from post-event measurements using the captured waveforms, the determined energy-related information from post-event measurements including at least one of energy-related parameter(s), a signal(s), an indicator(s), a status(es), and other information;
identifying and/or deriving and/or calculating additional information associated with the at least one identified power event by comparing (a) the determined energy-related information from pre-event measurements, with (b) the determined energy-related information from post-event measurements; and
performing at least one action affecting at least one component in the electrical power system, providing additional actionable information to event report(s), or providing extracted signal(s) to an automated event analysis system,
wherein the method further comprises:
determining at least one cause of the at least one identified power event from the additional information; or
determining an impact of the at least one identified power event on equipment in the electrical power system.

2. The method of claim 1, wherein the at least one identified power event includes a power quality event.

3. The method of claim 1, wherein the additional information includes discriminate additional information, and the discriminate additional information is used to describe what type of loads in the electrical power system were either disconnected or de-energized, or added or energized in response to the power event.

4. The method of claim 1, wherein the waveform capturing is performed by at least one Intelligent Electronic Device (IED) in the electrical power system, which is coupled to electrical power system equipment.

5. The method of claim 1, wherein the at least one component includes equipment in the electrical power system.

6. The method of claim 1, wherein the first-time period or the second-time period is adjustable according to an electrical or power condition in the electrical power system.

7. The method of claim 1, wherein the at least one identified power event includes at least one power quality event, and the first-time period or the second-time period may vary according to the duration(s) of the at least one power quality event.

8. The method of claim 1, wherein the determined energy-related information from pre-event measurements, and/or the determined energy-related information from post-event measurements, includes at least one of alternating current (AC) and/or direct current (DC) voltage signals, AC and/or DC current signals, power, distortion, DC offsets, noise, discrete phase data, frequency, phase angles, the state or occurrence of load loss which may reflect that something was added to or removed from the electrical power system during the at least one identified power event, percentage of load loss, power factor change, changes in the steady state voltage/current shapes and/or other measured and/or derived information.

9. The method of claim 1, wherein the determined energy-related information from pre-event measurements, and/or the determined energy-related information from post-event measurements, indicates whether load(s) are being added to or removed from the electrical power system during the at least one identified power event, the adding of the load(s) indicating energization of the load(s) and the removal of the load(s) indicating de-energization of the load(s).

10. The method of claim 1, wherein the at least one identified power event is detected and categorized by monitoring, identifying, capturing and analyzing measured and/or derived data associated with the monitored at least one of the voltage and current signal.

11. The method of claim 1, where the captured waveforms are analyzed to identify relevant representative parameters, elements, and/or statistical/analysis dimensions, such as magnitude of an electrical property, harmonic distortion, power factor, duration of the identified power event, event severity, origin of a disturbance source, or other event characteristics.

12. The method of claim 1, wherein the at least one action is performed by a power meter, protective device, load, process, control device or other system/device associated with the electrical power system.

13. The method of claim 1, wherein the additional information includes a phase shift of the energy-related signals, which satisfies at least one phase shift criterion.

14. The method of claim 1, wherein the other information includes the location(s) of certain components in the electrical power system.

15. The method of claim 1, further comprising:
when the captured waveforms represent an unknown event profile of the electrical power system, creating a new event profile based on the captured waveforms; and updating a digital repository stored in a memory with the new event profile.

16. A system for analyzing power events in an electrical power system, the system comprising:
memory;
one or more sensors configured to sense at least one of a voltage and current signal in the electrical power system; and
one or more processors configured to:
monitor at least one of a voltage and current signal using the one or more sensors;
identify at least one power event in the electrical power system from the monitored at least one of the voltage and current signal;
in response to identifying the at least one power event, capture waveforms of the monitored at least one of the voltage and current signal from a first-time period before a start of the identified power event to a second-time period after a terminus of the identified power event;
determine energy-related information from pre-event measurements using the captured waveforms, the determined energy-related information from pre-event measurements including at least one of energy-related parameter(s), a signal(s), an indicator(s), a status(es), and other information;
determine energy-related information from post-event measurements using the captured waveforms, the determined energy-related information from post-event measurements including at least one of energy-related parameter(s), a signal(s), an indicator(s), a status(es), and other information;
identify and/or derive and/or calculate additional information associated with the at least one identified power event by comparing (a) determined energy-related information from pre-event measurements, with (b) the determined energy-related information from post-event measurements; and
perform at least one action affecting at least one component in the electrical power system, provide additional actionable information to event report(s), or provide extracted signal(s) to an automated event analysis system,
wherein the one or more processors are further configured to:
determine at least one cause of the at least one identified power event from the additional information; or
determine an impact of the at least one identified power event on equipment in the electrical power system.

17. The system of claim 16, wherein the at least one identified power event includes a power quality event.

18. A tangible computer medium storing computer executable code, which when executed by a processor, is configured to implement a method of analyzing power events in an electrical power system, the method comprising:
monitoring at least one of a voltage and current signal in the electrical power system;
identifying at least one power event in the electrical power system from the monitored at least one of the voltage and current signal;
in response to identifying the power event, capturing waveforms of the monitored at least one of the voltage and current signal from a first-time period before a start of the identified power event to a second-time period after a terminus of the identified power event;

determining energy-related information from pre-event measurements using the captured waveforms, the determined energy-related information from pre-event measurements including at least one of energy-related parameter(s), a signal(s), an indicator(s), a status(es), and other information;

determining energy-related information from post-event measurements using the captured waveforms, the determined energy-related information from post-event measurements including at least one of energy-related parameter(s), a signal(s), an indicator(s), a status(es), and other information;

identifying and/or deriving and/or calculating additional information associated with the at least one identified power event by comparing (a) the determined energy-related information from pre-event measurements, with (b) the energy-related information from post-event measurements; and performing at least one action affecting at least one component in the electrical power system, providing additional actionable information to event report(s), or providing extracted signal(s) to an automated event analysis system, wherein the method further comprises:
- determining at least one cause of the at least one identified power event from the additional information; or
- determining an impact of the at least one identified power event on equipment in the electrical power system.

* * * * *